(12) United States Patent
Miyajima

(10) Patent No.: US 7,932,132 B2
(45) Date of Patent: Apr. 26, 2011

(54) SEMICONDUCTOR DEVICE AND METHOD OF MANUFACTURING THE SAME

(75) Inventor: Takeshi Miyajima, Anjo (JP)

(73) Assignee: DENSO CORPORATION, Kariya (JP)

( * ) Notice: Subject to any disclaimer, the term of this patent is extended or adjusted under 35 U.S.C. 154(b) by 157 days.

(21) Appl. No.: 12/379,500

(22) Filed: Feb. 24, 2009

(65) Prior Publication Data

US 2009/0227070 A1    Sep. 10, 2009

(30) Foreign Application Priority Data

Mar. 7, 2008    (JP) ................................. 2008-057480
Nov. 11, 2008    (JP) ................................. 2008-288656

(51) Int. Cl.
*H01L 21/00*    (2006.01)
(52) U.S. Cl. ................. 438/122; 438/462; 257/E21.511
(58) Field of Classification Search .................. 438/114, 438/122; 257/E21.511
See application file for complete search history.

(56) References Cited

U.S. PATENT DOCUMENTS

| | | | |
|---|---|---|---|
| 6,156,980 A * | 12/2000 | Peugh et al. | 257/E21.511 |
| 6,180,881 B1 * | 1/2001 | Isaak | 257/686 |
| 6,873,043 B2 | 3/2005 | Oman | |
| 6,927,471 B2 * | 8/2005 | Salmon | 438/106 |
| 2007/0278550 A1 | 12/2007 | Asai et al. | |

FOREIGN PATENT DOCUMENTS

| | | |
|---|---|---|
| JP | A-11-087573 | 3/1999 |
| JP | A-11-145352 | 5/1999 |
| JP | A-2003-031725 | 1/2003 |
| JP | A-2008-16818 | 1/2008 |

OTHER PUBLICATIONS

Office Action issued on Mar. 16, 2010 by the Japan Patent Office in corresponding Japanese Application No. 2008-288656 (English translation enclosed).

* cited by examiner

*Primary Examiner* — Chandra Chaudhari
(74) *Attorney, Agent, or Firm* — Posz Law Group, PLC

(57) ABSTRACT

A semiconductor device and a method of manufacturing the same are disclosed. The semiconductor device includes: a casing, a board and a semiconductor chip. The chip includes: an element part; a heat sink bonded to the element part; an insulating layer located on the heat sink so that the heat sink is located between the element part and the insulating layer; and a side wall insulating layer covering all of end faces of the heat sink. The semiconductor chip is located between the casing and the board, so that the insulating layer is directed to the casing to enable heat radiation from the heat sink toward the casing via the insulating layer.

44 Claims, 15 Drawing Sheets

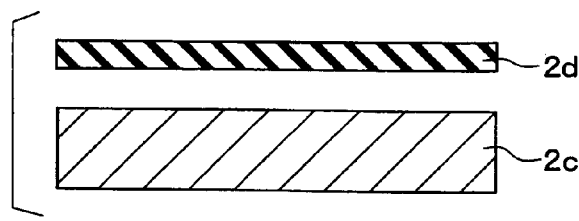
FIG. 2A
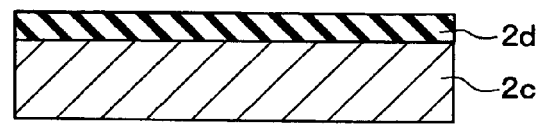
FIG. 2B
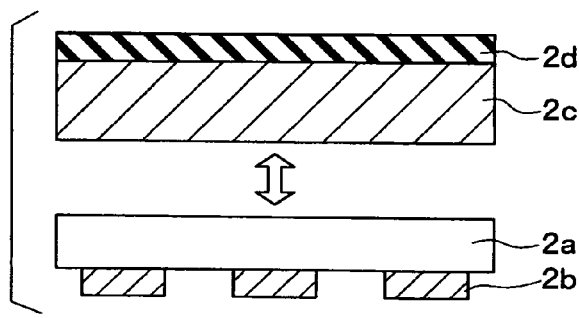
FIG. 2C
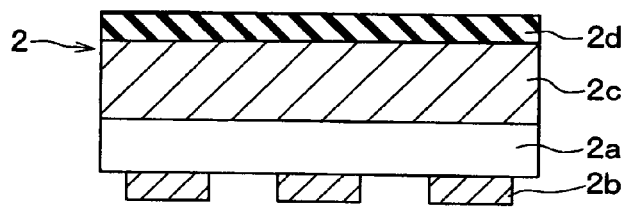
FIG. 2D
FIG. 2E
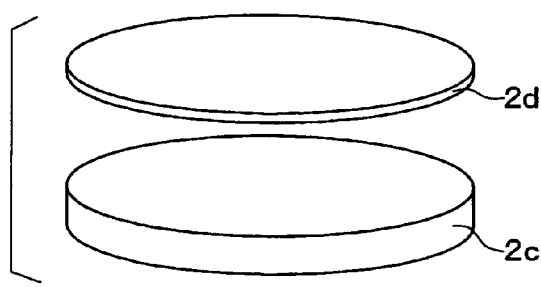
FIG. 2F
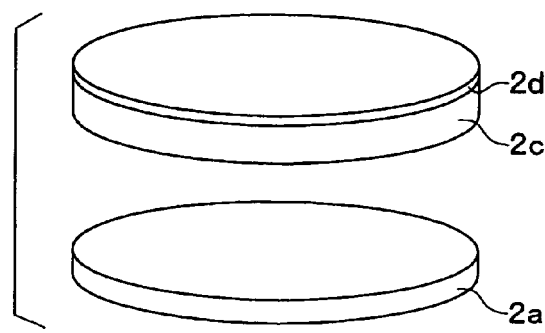

SEMICONDUCTOR DEVICE AND METHOD OF MANUFACTURING THE SAME

CROSS REFERENCE TO RELATED APPLICATION

The present application is based on Japanese Patent Applications No. 2008-57480 filed on Mar. 7, 2008 and No. 2008-288656 filed on Nov. 11, 2008, the disclosures of which are incorporated herein by reference.

BACKGROUND OF THE INVENTION

1. Field of the Invention

The present invention relates to a semiconductor device having a configuration for heat radiation from a semiconductor chip to a casing. The present invention also relates to a method for manufacturing such a semiconductor device.

2. Description of Related Art

There is known a semiconductor device that has a face-down mounting structure. In a typical face-down mounting structure, an electrode is located on one surface of a semiconductor chip, and is electrically connected to a wiring pattern of a board with the one surface of the semiconductor chip being directed to the board. For improvement of heat radiation efficiency from a semiconductor chip having a face-down mounting structure, a heat sink made of metal or the like is connected to another surface of the semiconductor chip, wherein the another surface is opposite to the one surface where the electrode is located (cf. U.S. Pat. No. 6,873,043).

Discussion is presented below on the above semiconductor device, as a related art. Heat radiation efficiency may improve by contacting a heat sink with a semiconductor chip or a casing that receives a board. However, since the heat sink and the casing are typically made of metal, the contact between the casing and the heat sink leads to a state where the heat sink and the casing are electrically connected. In such a case, there may generate a leak between a back side of the semiconductor chip and the casing. It is thus necessary to place an insulating layer between the heat sink and the casing to prevent the direct contacting. For example, an insulating layer may be formed on a portion of the casing that is supposed to face the heat sink. Alternatively, an insulating film may be placed between the casing and the heat sink when the semiconductor chip and the heat sink are fixed to the casing. However, when the insulating layer is formed on the casing, it is required to form insulating layers on all casings one by one. Thus, a process of forming the insulating layer becomes complicated. When an insulating film is placed between the heat sink and the casing, it is required to place the insulating film every time when the semiconductor chip and the heat sink are fixed to the casing, which results in a complicated process.

SUMMARY OF THE INVENTION

In view of the above and other points, it is an objective of the present invention to provide a semiconductor device and a method of manufacturing a semiconductor device.

According to a first aspect of the present invention, a method for manufacturing a semiconductor device is provided. The method includes: forming an insulating layer on a first surface of a heat sink. The heat sink has a second surface opposite to the first surface. The method further includes: preparing a semiconductor wafer having first and second surfaces opposite to each other. The semiconductor wafer includes: an element part having an element; and an electrode part located on the element part to provide an electric connection to the element of the element part. The electrode part is disposed on the first surface of the semiconductor wafer. The method further includes: bonding the second surface of the heat sink to the second surface of semiconductor wafer; and forming a semiconductor chip through a cutting process. The cutting process includes: dividing the semiconductor wafer together with the heat sink and the insulating layer into chips by cutting along a scribe line. The method further includes: mounting the semiconductor chip to a board having a wiring pattern, so that the electrode part of the semiconductor chip is electrically connected to the wiring pattern of the board; and positioning the semiconductor chip and the board relative to a casing made of metal. The positioning includes: directing the insulating layer of the semiconductor chip to the casing to enable heat radiation from the heat sink toward the casing via the insulating layer.

According to the above method, it is possible to simplify a process of forming an insulating layer for insulating a heat sink and a casing from each other.

According to a second aspect of the present invention, a method for manufacturing a semiconductor device is provided. The method includes: preparing multiple discrete heat sinks each having first and second surfaces opposite to each other. Each of the discrete heat sinks has an insulating layer on the first surface of the each of the discrete heat sinks. The method further includes: preparing a semiconductor wafer having first and second surfaces opposite to each other. The semiconductor wafer has: multiple element parts each having an element; and multiple electrode parts disposed on the first surface of the semiconductor wafer. The electrode parts are respectively located on the element parts so that each of the electrode parts provides an electric connection to a corresponding one of the element parts. The method further includes bonding the discrete heat sinks to the semiconductor wafer, so that: the second surface of the each of the discrete heat sinks is bonded to the second surface of the semiconductor wafer; and the discrete heat sinks are respectively located on places that correspond to the element parts. The method further includes: forming a semiconductor chip through a cutting process. The cutting process includes: dividing into chips the semiconductor wafer to which the discrete heat sinks are bonded, by cutting along a scribe line, so that each chip has a corresponding one of the discrete heat sinks and a corresponding one of the element parts. The method further includes: mounting the semiconductor chip to a board having a wiring pattern, so that the electrode part of the semiconductor chip is electrically connected to the wiring pattern of the board; and positioning the semiconductor chip and the board relative to a casing made of metal. The positioning includes: directing the insulating layer of the semiconductor chip to the casing to enable heat radiation from the heat sink toward the casing via the insulating layer.

According to the above method, it is possible to simplify a process of forming an insulating layer for insulating a heat sink and a casing from each other.

According to a third aspect of the present invention, a method for manufacturing a semiconductor device is provided. The method includes: preparing multiple discrete heat sinks each having first and second surfaces opposite to each other; preparing a semiconductor wafer having first and second surfaces opposite to each other. The semiconductor wafer has: multiple element parts each having an element; and multiple electrode parts disposed on the first surface of the semiconductor wafer. The electrode parts are respectively located on the element parts so that each of the electrode parts provides an electric connection to a corresponding one of the element parts. The method further includes: bonding the discrete heat sinks to the semiconductor wafer so that: the second surface of the each of the discrete heat sinks is bonded to the second surface of the semiconductor wafer; and the discrete heat sinks are respectively located on places that correspond to the element parts. The method further includes: filling a gap between the discrete heat sinks with an insulating material and forming an insulating layer on the first surface of each of the discrete heat sink; and forming a semiconductor chip through a cutting process. The cutting process includes cut, along a scribe line, of the insulating material together with the semiconductor wafer to which the discrete heat sinks are bonded, so that: chips are provided by dividing; each chip has a corresponding one of the discrete heat sinks and a corresponding one of the element parts; and the each chip has a side-wall insulating film that is made of the insulating material and that covers an end face of the heat sink. The method further includes: mounting the semiconductor chip to a board having a wiring pattern, so that the electrode part of the semiconductor chip is electrically connected to the wiring pattern of the board; and positioning the semiconductor chip and the board relative to a casing made of metal. The positioning includes: directing the insulating layer of the semiconductor chip to the casing to enable heat radiation from the heat sink toward the casing via the insulating layer.

According to the above method, it is possible to simplify a process of forming an insulating layer for insulating a heat sink and a casing from each other.

According to a fourth aspect of the present invention, a method for manufacturing a semiconductor device is provided. The method includes: preparing multiple discrete heat sinks each having first and second surfaces opposite to each other. Each of the discrete heat sinks has an insulating layer on the first surface the each of the discrete heat sinks. The method further includes: preparing a semiconductor wafer having first and second surfaces opposite to each other. The semiconductor wafer has: multiple element parts each having an element; and multiple electrode parts respectively located on the element parts. The electrode parts are disposed on the first surface of the semiconductor wafer, so that each of the electrode parts provides an electrical connection to the element of a corresponding one of the element parts. The method further includes: bonding the discrete heat sinks to the semiconductor wafer so that: the second surface of the each of the discrete heat sinks is bonded to the second surface of the semiconductor wafer; and the discrete heat sinks are respectively located on places that correspond to the element parts. The method further includes: bonding a support member to the first surface of the semiconductor wafer; dividing into portions the semiconductor wafer to which the discrete heat sinks are bonded, so that the divided portions respectively have the element parts; filling with an insulating material a gap between the discrete heat sinks and a gap between the element parts; and forming a semiconductor chip through a cutting process. The cutting process includes: cutting the insulating material along a scribe line to provide chips by dividing, so that the semiconductor chip has a side-wall insulating film that is made of the insulating material and that covers an end face of the heat sink and an end face of the element part. The method further includes: mounting the semiconductor chip to a board having a wiring pattern, so that the electrode part of the semiconductor chip is electrically connected to the wiring pattern of the board; and positioning the semiconductor chip and the board relative to a casing made of metal. The positioning includes: directing the insulating layer of the semiconductor chip to the casing to enable heat radiation from the heat sink toward the casing via the insulating layer.

According to the above method, it is possible to simplify a process of forming an insulating layer for insulating a heat sink and a casing from each other.

According to a fifth aspect of the present invention, a method for manufacturing a semiconductor device is provided. The method includes: forming an insulating layer on a first surface of a heat sink. The heat sink has a second surface opposite to the first surface. The method further includes: preparing a semiconductor wafer having first and second surfaces opposite to each other. The semiconductor wafer includes: an element part having an element; and an electrode part located on the element part to provide an electric connection to the element of the element part. The electrode part is disposed on the first surface of the semiconductor wafer. The method further includes: bonding the second surface of the heat sink to the second surface of semiconductor wafer; and forming a semiconductor chip through a cutting process. The cutting process includes: dividing the semiconductor wafer together with the heat sink and the insulating layer into chips by cutting along a scribe line.

According to the above method, it is possible to simplify a process of forming an insulating layer for insulating a heat sink and a casing from each other.

According to a sixth aspect of the present invention, a semiconductor device is provided. The semiconductor device includes: a casing made of metal; a board having a wiring pattern; and a semiconductor chip. The semiconductor chip includes: an element part located in a semiconductor substrate, having an element, and having first and second surface opposite to each other; an electrode part located on the first surface of the element part to provide an electrical connection to the element of the element part; a heat sink bonded to the second surface of the element part; a insulting layer located on the heat sink so that the heat sink is located between the element part and the insulating layer; and a side wall insulating layer covering all of end faces of the heat sink. The semiconductor chip is located between the casing and the board, so that the electrode part of the semiconductor chip is electrically connected with the wiring pattern of the board, and so that heat from the heat sink is radiated toward the casing via the insulating layer.

According to the above semiconductor device, it is possible to ensure insulation from the semiconductor chip from the casing.

BRIEF DESCRIPTION OF THE DRAWINGS

The above and other objects, features and advantages of the present invention will become more apparent from the following detailed description made with reference to the accompanying drawings. In the drawings:

FIGS. 2A to 2D are cross sectional diagrams each illustrating a manufacturing process of a semiconductor device in accordance with a first embodiment;

FIG. 2E is a perspective view that corresponds to FIG. 2A;

FIG. 2F is a perspective view that corresponds to FIG. 2C;

FIG. 3 is a cross sectional diagram illustrating a MOSFET that a manufacturing method according to a first embodiment is applicable to;

DETAILED DESCRIPTION OF THE EXEMPLARY EMBODIMENTS

Figure 1:
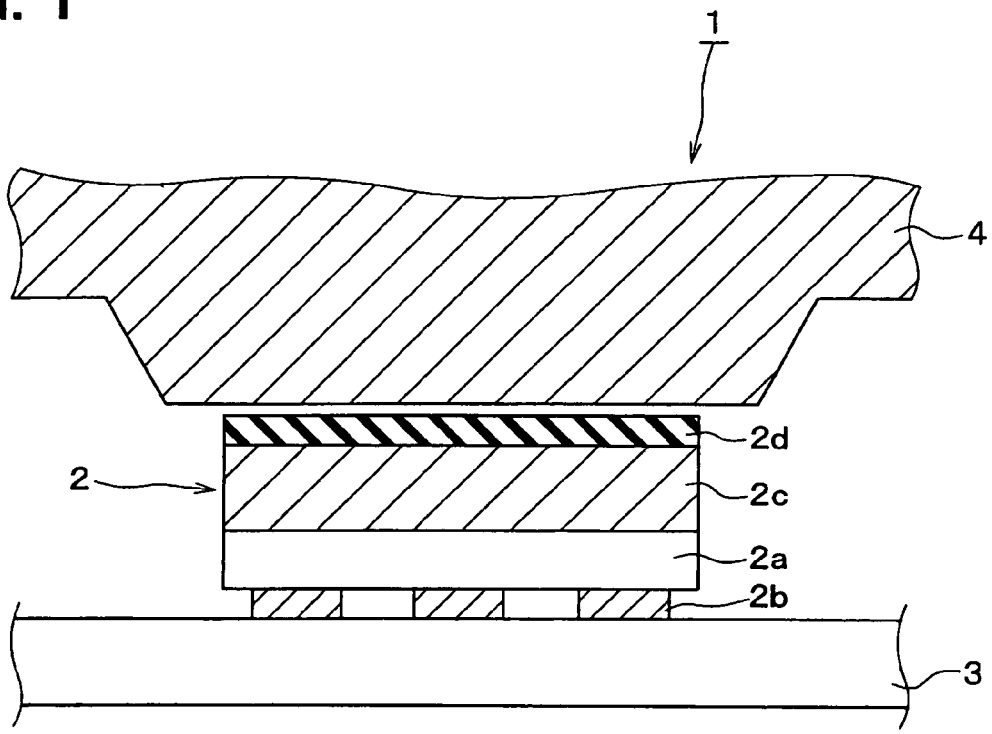
FIG. 1 is a cross sectional diagram illustrating a semiconductor device in accordance with a first embodiment.

Exemplary embodiments are described below with reference to the accompanying drawings. In the followings, like parts refer to like reference numerals.

First Embodiment

A first embodiment is described below. FIG. 1 is a cross sectional diagram illustrating a semiconductor device 1 in accordance with a first embodiment.

The semiconductor device 1 includes parts illustrated in, for example, FIG. 1 as a portion of the semiconductor device 1. The semiconductor device 1 may correspond to, for example, a power package having a power device, a central processing unit (CPU) generating a large amount of heat, or a passive device generating a large amount of heat. Alternatively, the semiconductor device 1 may correspond to a power unit having an element in addition to the above power package. Alternatively, the semiconductor device 1 may correspond to an electronic control unit (ECU) having a circuit or the like in addition to the above power package.

As shown in FIG. 1, the semiconductor device 1 includes a semiconductor chip 2, a board 3 (i.e., a printed circuit board) and a casing 4.

The semiconductor chip 2 includes an element part 2a, an electrode part 2b, a heat sink 2c and an insulating layer 2d.

The element part 2a is formed through dividing into chips a semiconductor substrate in which semiconductor elements are formed. The electrode part 2b is formed on a front surface side of the element part 2a. The heat sink 2c is bonded to a rear surface side of the element part 2a. The insulating layer 2d is formed on a front surface of the heat sink 2c.

The element part 2a includes a semiconductor element such as a MOSFET, IGBT or the like. The semiconductor element includes impurity regions. One or more of the impurity regions is electrically connected with the electrode part 2b. The electrode part 2b includes, for instance, a conductive bump made of solder. The heat sink 2c includes a metal plate made of, for example, copper. The heat sink 2c can be used for heat radiation from the element part 2a. More specifically, the semiconductor device 1 is configured such that the heat generated in the element part 2a is radiated through heat conduction to the casing 4 via the heat sink 2c. The heat sink 2c and the casing 4 can be made of metal when heat radiation performance is took into account. If the heat sink 2c and the casing 4 made of metal merely contact with each other, the heat sink 2c and the casing 4 are electrically connected with each other. To insulate the heat sink 2c and the casing 4 from each other, the insulating layer 2d is disposed on the front surface of the heat sink 2c. The insulating layer 2d may be made of a material having a high thermal conductivity of, for example, 10 W/mK or more, and may have a film shape having a thickness of, for example, 100 μmm.

The board 3 is, for example, a printed circuit board, a ceramic board, or the like. The board 3 has a wiring pattern. The semiconductor chip is disposed face-down on the board 3 and the electrode part 2b of the element part 2a is electrically connected to a predetermined part of the wiring pattern of the board 3. Thereby, the semiconductor element can be connected to or mounted to an electric circuit inside the casing 4.

The casing 4 receives the element part 2a and the board 3. The casing 4 is made of metal to improve heat radiation performance, as described above. The casing 4 may further receive another element (not shown) mounted to the board 3.

The semiconductor device 1 according to the present embodiment has the above configuration. A method of manufacturing such a semiconductor device 1 is described below.

FIGS. 2A to 2D are cross sectional diagrams each illustrating a manufacturing process of a semiconductor device in accordance with the present embodiment. FIG. 2E is a perspective view that corresponds to FIG. 2A. FIG. 2F is a perspective view that corresponds to FIG. 2C.

In a process exemplified in FIG. 2A, a metal plate for use in forming the heat sink 2c is prepared. In addition, an insulating film made of an insulating material is prepared. Then, as shown in FIG. 2B, the insulating film is bonded to a first surface of the metal plate by thermo compression bonding to integrate together. Thereby, a heat sink 2c having an insulating layer 2d on the first surface is formed.

In a process exemplified in FIG. 2C, a single semiconductor wafer is prepared. Through a semiconductor process technology, a semiconductor element and an electrode part 2b is formed in the semiconductor wafer, so that the electrode part 2b is located on a first surface side of the semiconductor wafer. Then, the heat sink 2c having an insulating layer is arranged relative to the semiconductor wafer such that a side of the heat sink 2c (i.e., a second surface side) opposite to the insulating layer side faces a side of the semiconductor wafer (a second surface side) opposite to an electrode part side. Then, in a process exemplified in FIG. 2D, the heat sink 2c having the insulating layer is bonded to the semiconductor wafer by using, for example, an adhesive agent. In the above case, a shape of the metal plate or the insulating layer 2d may be different from that of the semiconductor wafer. Alternatively, a shape of the metal plate or the insulating layer may be similar to that of the semiconductor wafer. For example, a shape having an orientation flat may be employed, which shape may be circular with a part being cut. When the orientation flat is provided, it is possible to perform subsequent processes by using a semiconductor process technology. For example, it is possible to perform subsequent processes with various apparatuses for a semiconductor process technology. The bonding of the heat sink 2c to the semiconductor wafer may made by direct wafer bonding without using an adhesive agent.

Then, the semiconductor wafer together with the insulating layer 2d and the heat sink 2c are diced into chips. Through the above manners, a semiconductor chip 2 as exemplified in FIG. 1 is manufactured that includes the element part 2a, the electrode part 2b, the heat sink 2c and the insulating layer 2d. Since the semiconductor chip 2 is manufactured through the above manners, the element part 2a, the heat sink 2c and the insulating layer 2d have end faces (i.e., side surfaces) produces by the dicing cut, and the end faces are generally in a same plane.

The semiconductor chip 2 is placed face-down, bonded and mounted to the board 3 by using, for example, flip chip or solder. Then, the semiconductor chip 2 and the board 3 are accommodated in the casing 4. Through the above manners, the semiconductor device 1 as exemplified in FIG. 1 is manufactured.

According to the present embodiment, as described above, it is possible to manufacture multiple semiconductor chips 2 at one time through: bonding a heat sink 2c and an insulating layer 2d to a semiconductor wafer that is in the form of wafer and that a semiconductor element is formed in; and dicing or cutting the semiconductor wafer together with the heat sink 2c and the insulating layer 2d. Therefore, the semiconductor chip 2 has already included the insulating layer 2d in manufacturing a semiconductor device 1 having a configuration for heat radiation from a heat sink 2c to a casing 4 via an insulating layer 2d. Thus, it becomes possible to simplify a process of forming an insulating film for insulation between the heat sink 2c and the casing 4, compared to a case where it is necessary to place an insulating film every time when a heat sink 2c bonded to an element part 2a is fixed to the casing 4. Further, the semiconductor device 1 is configured such that the insulating layer 2d is directly formed on the semiconductor chip 2. Thus, the insulating layer 2d needs not to be large, compared to a case where it is necessary to bond an insulating layer to a semiconductor chip in a later process. Consequently, it is possible to downsize the semiconductor device.

The above manufacturing method is applicable to almost any types of semiconductor devices 1 having a structure for heat radiation. In particular, the above manufacturing method may be usefully applied to a semiconductor device having a power device generating a large amount of heat or a device with non-negligible switching loss. Such a power device is for example a MOSFET, an IGBT or the like. The device with non-negligible switching loss is for example a high-frequency switching device.

Figure 3:
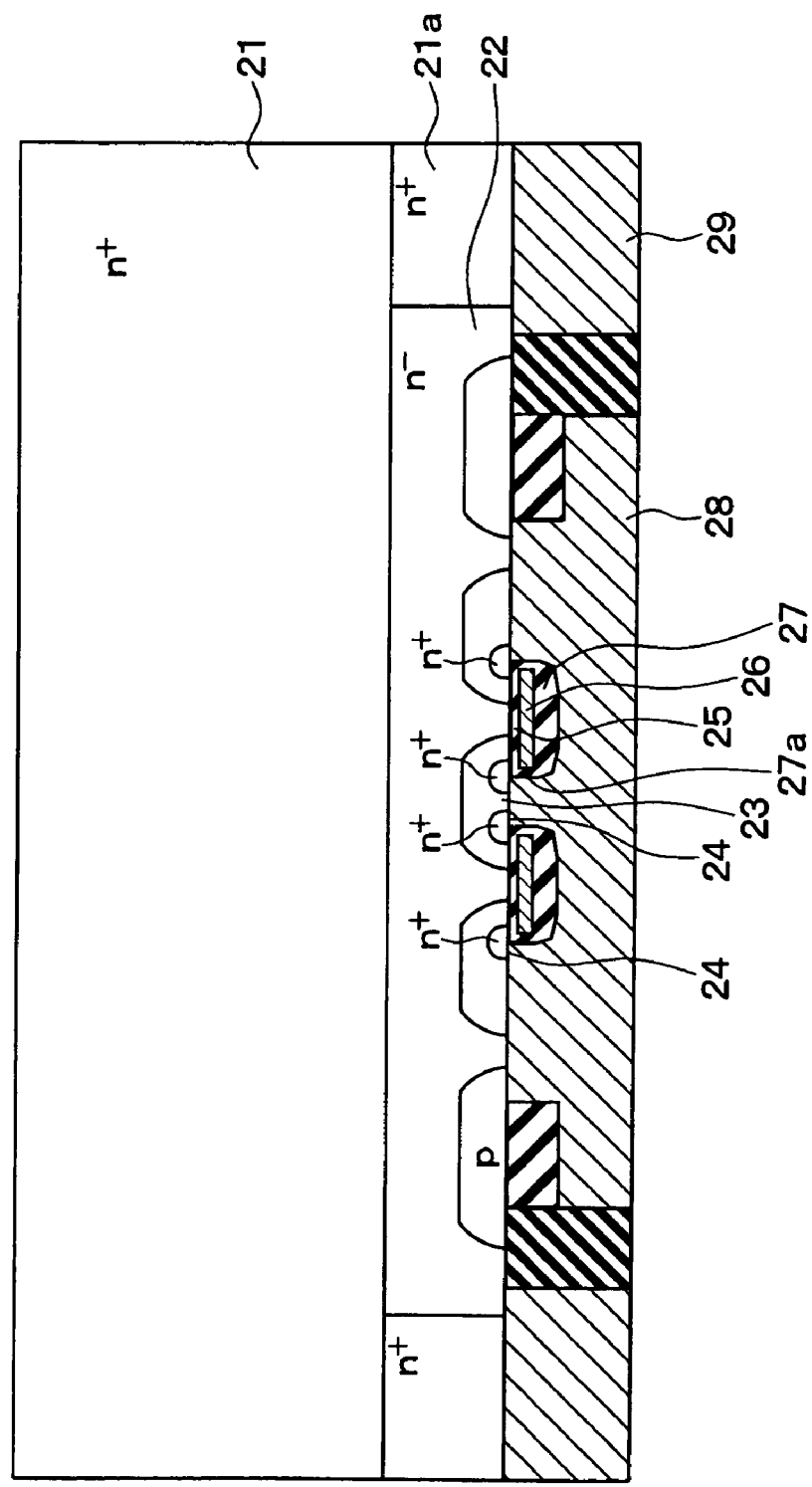

It may be suitable to apply the above manufacturing method to fabrication of a MOSFET having a sectional configuration as exemplified in FIG. 3.

As shown in FIG. 1, the element part 2a is located on an electrode part 2b side of the semiconductor chip 2. The element part 2a can have a configuration described as follows. As shown in FIG. 3, an n− type drift layer 22 is formed in a surface portion of an n+ type substrate 21. A p type base region 23 is formed in a surface portion of the n+ type substrate 21. A n+ type source region 24 is formed so as to terminate inside the p type base region 23. A gate insulating film 25 is formed on a surface of the element part 2a. A gate electrode 26 is formed so that, through the gate insulating film 25, the gate electrode 26 faces a part of a surface of the p type base region 23, which part of the surface of the p type base region 23 is located between the n− type drift layer 22 and the n+ type source region 24.

Further, an interlayer insulating film 27 is formed so as to cover the gate electrode 26. A source electrode 28 is formed so as to cover the interlayer insulating film 27. Through a contact hole formed in the insulating film 27, the source electrode 28 is electrically connected with the n+ type source region 24 and the p type base region 23. The n+ type substrate 21 includes a n+ type contact region 21a as a part of the n+ type substrate 21, which may correspond to a remaindered region where the n− type drift layer 22 is not formed. A drain electrode 29 is formed on a surface of the n+ type contact region 21a.

When a semiconductor device includes a MOSFET as exemplified in FIG. 3, the above-described electrode part 2b is connected to a source electrode 28 or a drain electrode 29.

The MOSFET can have the above configuration. In such MOSFETs, application of a gate voltage to the gate electrode 26 controls formation of a channel in a surface portion of the base region 23. The channel can allow electrical conduction between the n+ type source region 24 and the n− type drift layer 22 for source-drain current flow. In the above case, an electronic current from the n− type drift layer 22 into the n+ type substrate 21 reaches to a drain electrode 29 via the n+ type contact region 21a. The above-described manufacturing method is applicable to a MOSFET having the above configuration.

Second Embodiment

In a first embodiment, the heat sink 2c is exposed from an end face of the semiconductor chip 2. When working voltages of a semiconductor element are less than or equal to 60 V for instance, a configuration of a first embodiment can sufficiently ensure insulation of the heat sink 2c or the element part 2a from the casing 4 by means of grounding the casing 4 or the like. However, since the heat sink 2c is conductor, when a semiconductor element in the semiconductor chip 2 operates at high voltages, the presence of a thin insulating layer 2d only is difficult to ensure the insulation of the heat sink 2c or the element part 2a from the casing 4. Taking into account semiconductor devices used in high voltages, the present embodiment presents a configuration for enhancing the insulation of the heat sink 2c or the element part 2a from the casing 4.

Figure 4:
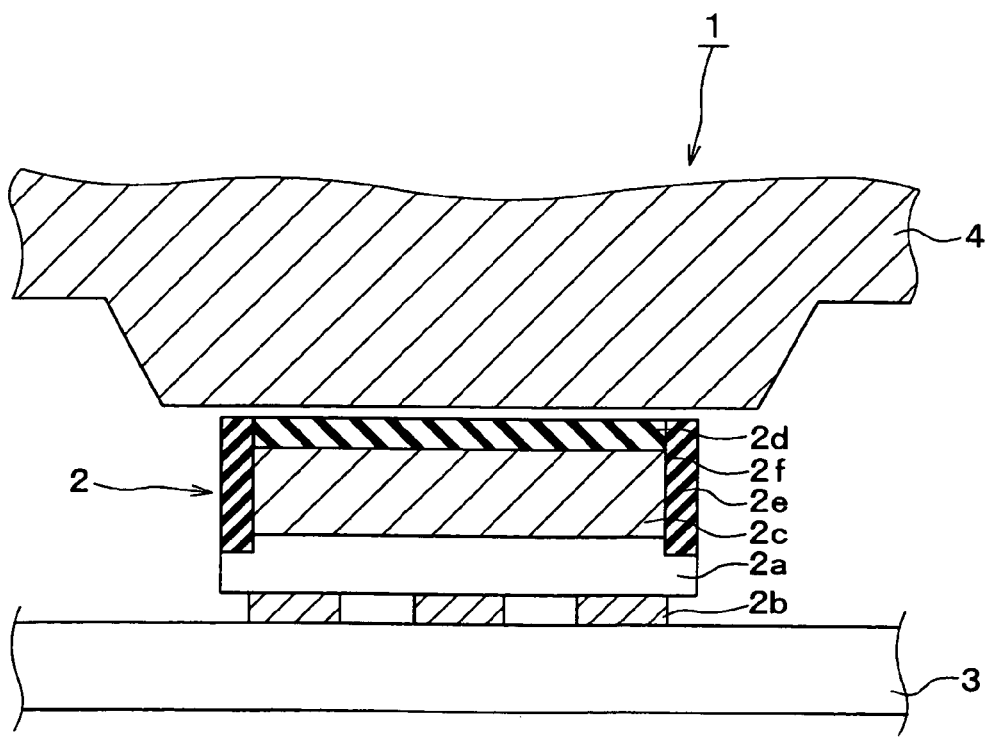
FIG. 4 is a cross sectional diagram illustrating a semiconductor device in accordance with a second embodiment.
Figure 5:
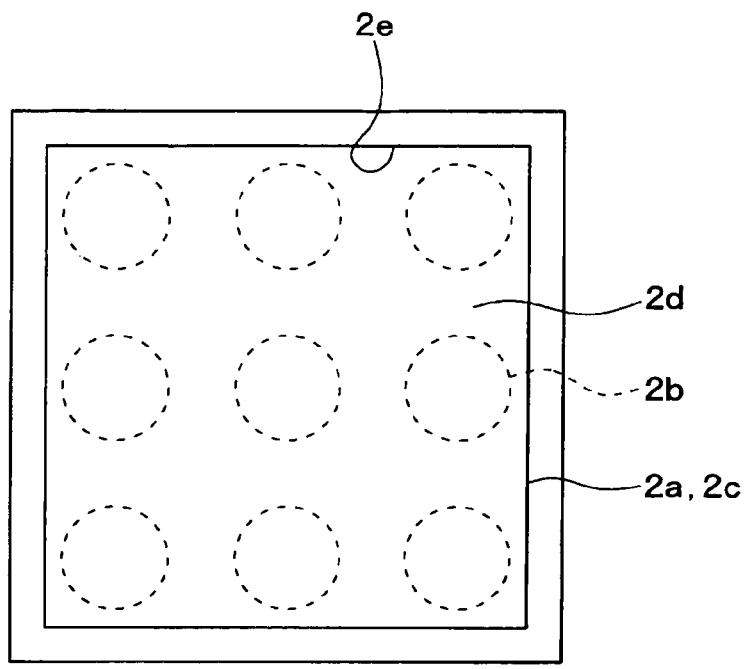
FIG. 5 is a layout diagram illustrating an upper side of a semiconductor device that corresponds to that in FIG. 4.

FIG. 4 is a cross sectional diagram illustrating a semiconductor device 1 in accordance with the present embodiment. FIG. 5 is a layout diagram illustrating an upper side of a semiconductor device 1. A difference between a first embodiment and a second embodiment includes a configuration for insulation between a heat sink 2c and a casing 4.

In the present embodiment, as shown in FIG. 4, the semiconductor chip 2 for the semiconductor device 1 includes the side-wall insulating film 2e on the end surface of a heat sink 2c. More specifically, the semiconductor chip 2 has a ditch 2f and the side-wall insulating film 2e in the ditch 2f. The ditch 2f is formed by partially removing the heat sink 2c and the element part 2a from a front surface side of the heat sink 2c. As shown in FIG. 5, the side-wall insulating film 2e is formed so as to wholly surround a periphery of the semiconductor chip 2. In the periphery, the side-wall insulating film 2e covers the end faces of the heat sink 2c. Accordingly, the end faces of the heat sink 2c are not exposed to an outside. In addition, a distance between an end face of the semiconductor chip 2 and the casing is made longer. The above configuration can enhance the insulation of the heat sink 2c or the element part 2a from the casing 4 in the end faces of the semiconductor chip 2.

A method of manufacturing the above semiconductor device 1 is described below in accordance with the present embodiment.

FIGS. 6A to D are cross sectional diagrams each illustrating a manufacturing process of a semiconductor device 1 in accordance with the present embodiment. Manufacturing processes of a semiconductor chip 2 of the present embodiment are generally similar to those of the first embodiment. Differences include those as shown in FIGS. 6A to 6D.

Figure 6A:
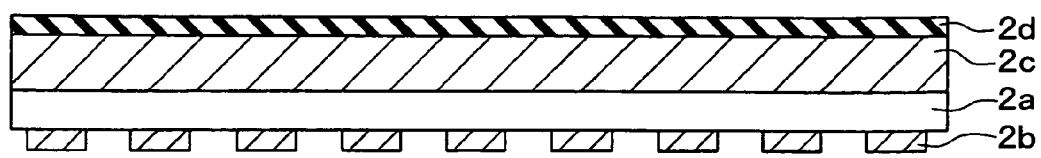
FIGS. 6A to 6D are cross sectional diagrams each illustrating a manufacturing process of a semiconductor device exemplified in FIG. 4.
Figure 6B:
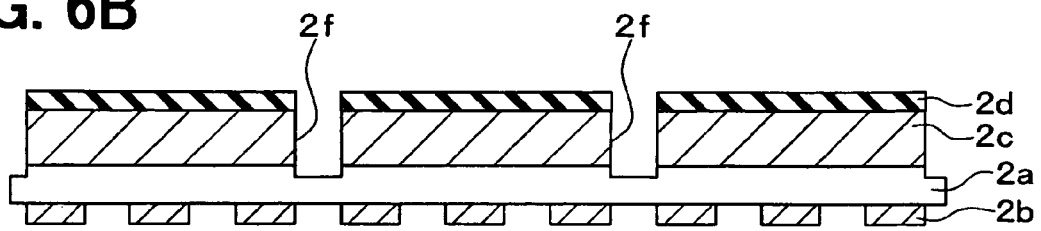

In a process exemplified in FIG. 6A, the processes exemplified in FIGS. 2A to 2D according to the first embodiment are performed. That is, a structure is formed in which a heat sink 2c and an insulating layer 2d are located on a rear surface side of a semiconductor wafer that a semiconductor element is formed in. Then, in a process exemplified in FIG. 6B, a ditch 2f is formed from the insulating layer 2d along a scribe line 5 (see FIG. 7). A depth of the ditch 2f is such that the semiconductor wafer is not cut into chips. More specifically, the ditch 2f penetrates the insulating layer 2d and the heat sink 2c, and has a bottom inside the semiconductor wafer. A width of the ditch 2f is set wider than a kerf width that is to be produced in a cutting process performed later. For example, a mask (not shown) is placed on the insulating layer 2d, and then, the ditch 2f is formed by, for example, etching or operating a dicing saw along the scribe line 5 from above the insulating layer 2d.

In the forming of the ditch 2f, a mark for alignment may be required. When, as described above, the insulating layer 2d and the heat sink 2c has a generally same shape as the semiconductor wafer, it is possible to precisely form the ditch 2f at a desired position since the orientation flat can be used as the mark for alignment. Alternatively, a mark for alignment may be preliminary formed in the heat sink 2c or the insulating layer 2d, and the heat sink 2c and the insulating layer 2d may be bonded to the semiconductor wafer by using the mark for alignment for positioning. In such a case, it is possible to form the ditch 2f while the mark for alignment is being identified from an insulating layer 2d side.

Figure 7:
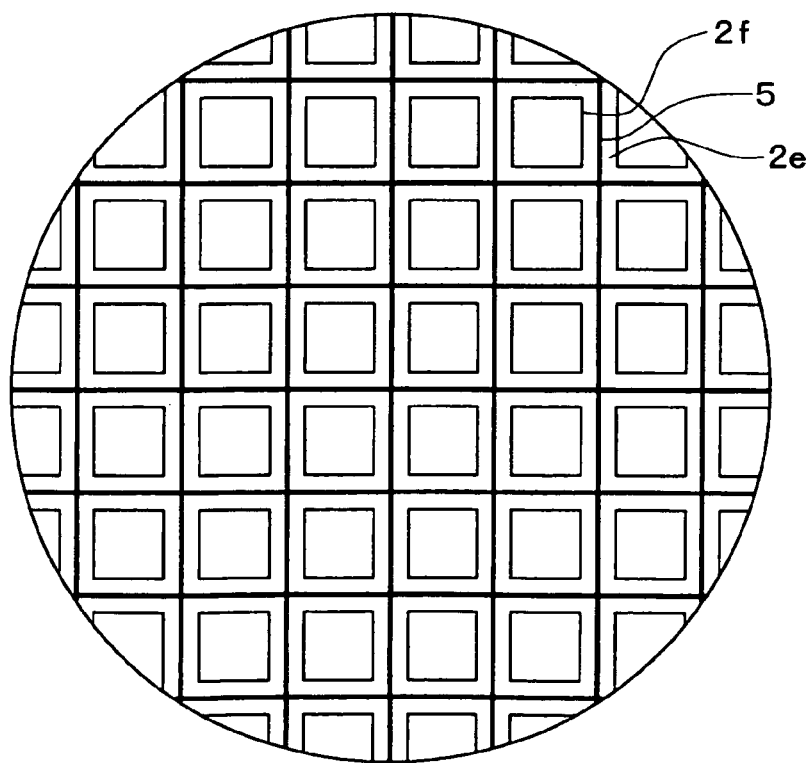
FIG. 7 is a layout diagram illustrating an upper side of a semiconductor device in a process of fling a ditch with an insulating material.
Figure 6C:
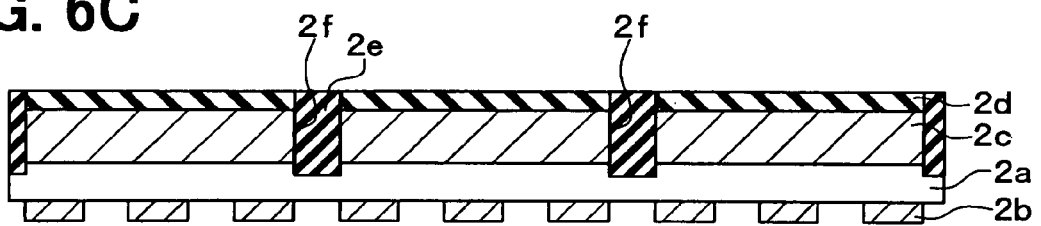

In a process exemplified in FIG. 6C, the ditch 2f is filled with an insulating material. For example, the ditch 2f is filled by spin coating a resin material or by depositing an insulating layer made of, for example, silicon oxide. The deposition of an insulating layer may be performed by chemical vapor deposition (CVD) at low temperatures. FIG. 7 is a layout diagram illustrating an upper side of a semiconductor device in a process of fling a ditch with an insulating material. As shown in FIG. 7, a width of the ditch 2f is wider than that of the scribe line 5, and the insulating material is embedded in the ditch 2f. The scribe line 5 is located along a center of the ditch 2f.

Figure 6D:
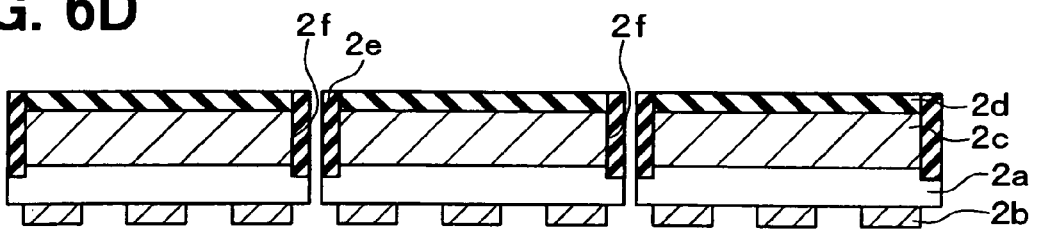

After the above processes, a cutting process is performed, as exemplified in the FIG. 6D. Dicing cutting along the scribe line 5 is carried out by using, for example, a dicing saw whose cutting width is smaller than the width of the ditch 2f. Thereby, the semiconductor wafer together with the insulating layer 2d and the heat sink 2c are divided into chips. Through the above process, the semiconductor chip 2 exemplified in FIG. 4 is manufactured, the semiconductor chip 2 having an element part 2a, an electrode part 2b, a heat sink 2c, an insulating layer 2d, and a side-wall insulating layer 2e that covers an end surface of the heat sink 2c.

In the above example, the cutting process is performed using a dicing saw. Alternatively, the cutting process can be carried using various techniques. For example, the cutting process may performed by etching, laser cutting, or the like. In the following embodiments, a cutting process by using a dicing saw will be explained as an example. However, in the following embodiments also, the cutting process can be performed using another technique.

The semiconductor device 1 of the present embodiment includes advantages that the semiconductor device 1 of the first embodiment have. In addition, according to the present embodiment, it is possible to enhance the insulation of the heat sink 2c or the element part 2a from the casing 4 in the end faces of the semiconductor chip 2, since the semiconductor chip 2 includes the side-wall insulating film 2e.

Third Embodiment

In the present embodiment, a method is presented below for manufacturing a configuration for insulation of the heat sink 2c or the element part 2a from the casing 4.

FIGS. 8A to 8D are cross sectional diagrams each illustrating a manufacturing process of a semiconductor chip 2 for a semiconductor device 1. Manufacturing processes of a semiconductor chip 2 of the present embodiment are generally similar to those of the first embodiment. Difference includes those shown in FIGS. 8A to 8D.

Figure 8A:
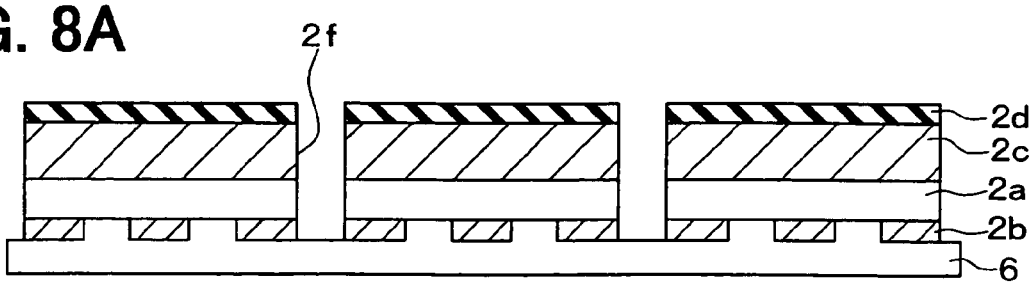
FIGS. 8A to 8D are cross sectional diagrams each illustrating a manufacturing process of a semiconductor device in accordance with a third embodiment.

In a process exemplified in FIG. 8A, the processes exemplified in FIGS. 2A to 2D according to the first embodiment are performed. That is, a structure is formed in which a heat sink 2c and an insulating layer 2d are located on a rear surface side of a semiconductor wafer that a semiconductor element has been formed in. Then, a support member 6 is bonded to the electrode part 2b and the front surface of the semiconductor wafer, so that the semiconductor wafer, the heat sink 2c and the insulating layer 2d are fixed. A ditch 2f is formed along the scribe line 5 from an insulating layer 2d side, so the semiconductor wafer together with the heat sink 2c and the insulating layer 2d are divided into portions for respective chips. The depth of the ditch 2f reaches to the support member 6 but is not so deep as to divide the support member 6 into pieces. In the above case, since the support member 6 is not divided, when the semiconductor wafer, the heat sink 2c and the insulating layer 2d are divided, the support member 6 supports the divided ones in an integral manner. For the above dividing, a process exemplified in FIG. 6B in the second embodiment can be employed.

Figure 8B:
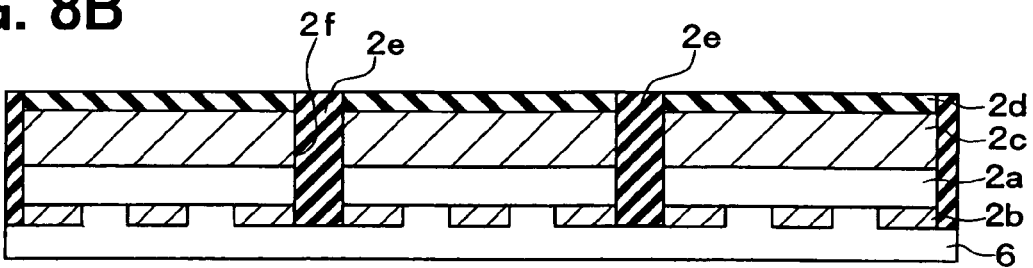
Figure 8C:
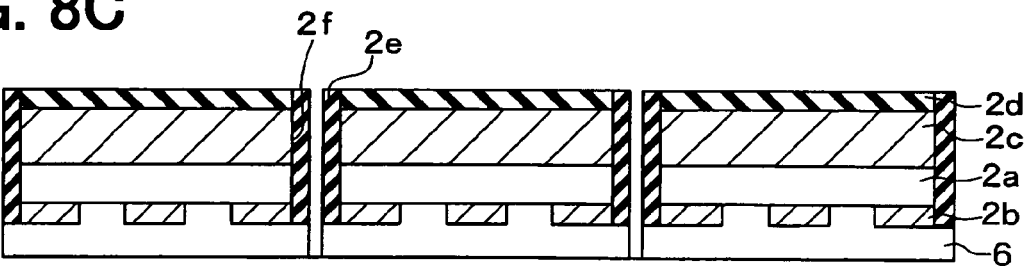
Figure 8D:
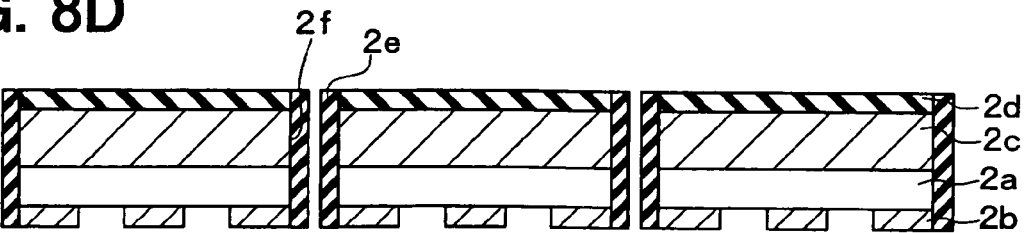

Then, in a process exemplified in FIG. 8B, the ditch 2f that provides the divided portions for respective chips is filled with an insulating material in a manner similar to that exemplified in FIG. 6C. Then, in a process exemplified in FIG. 8C, dicing cut is performed along the scribe line 5 by using a dicing saw whose kerf width is smaller than the width of the ditch 2f, in a manner similar to that exemplified in FIG. 6D. Thereby, it is possible to provide a semiconductor chip 2 whose end surfaces are entirely covered by a side-wall insulating film 2e. In the above manners, the dicing cut is performed so that a depth reaches to the support member 6 but does not divide the support member 6. Thus, when the semiconductor wafer, the heat sink 2c and the insulating layer 2d are divided, the support member 6 supports the divided ones in an integral manner. In a process exampled in FIG. 8D, the support member 6 is removed from the semiconductor chips 2. Thereby, it is possible to provide the semiconductor chip 2 having a configuration substantially identical to that of the second embodiment. Then, using the semiconductor chip 2 manufactured through the above manners, it is possible to manufacture a semiconductor device 1 similar to that of the second embodiment.

Fourth Embodiment

The present embodiment employs a semiconductor chip 2 that is manufactured through processes of a third embodiment. There will be described below a configuration and manufacturing method of a semiconductor device 1 that can further enhance the insulation of the heat sink 2c or the element part 2a from the casing 4.

Figure 9:
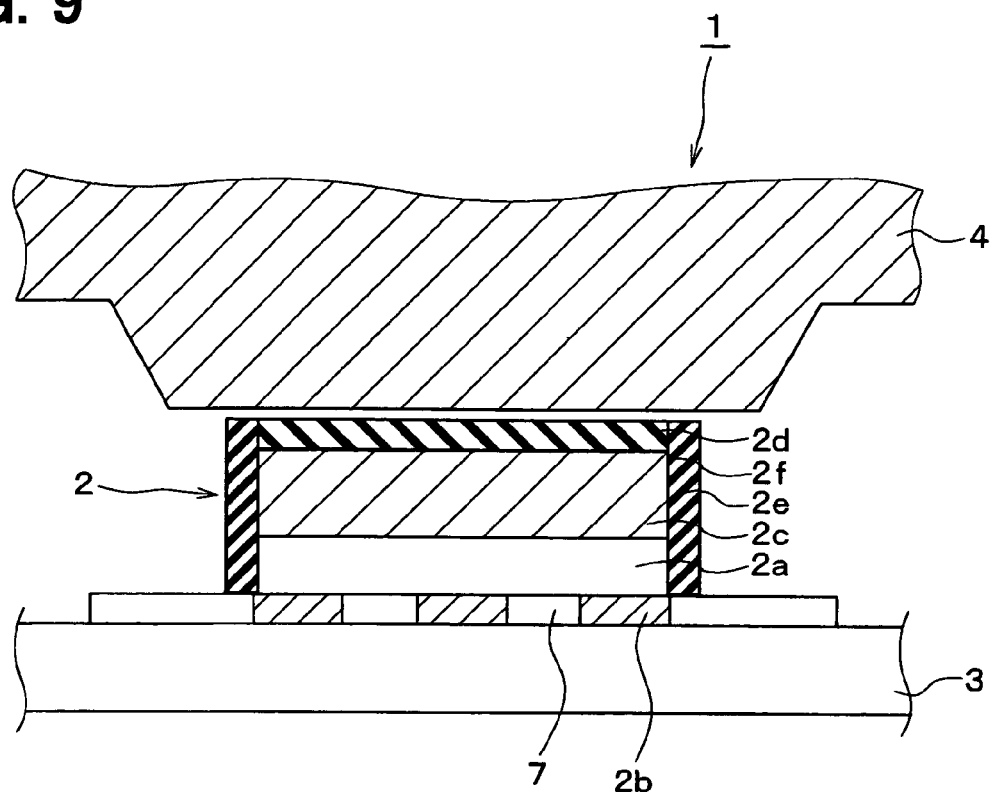
FIG. 9 is a cross sectional diagram illustrating a semiconductor device in accordance with a fourth embodiment.

FIG. 9 is a cross sectional diagram illustrating a semiconductor device 1 in accordance with the present embodiment. As shown in FIG. 9, the semiconductor device 1 includes a board 3 and a semiconductor chip 2 formed by a manufacturing method of a third embodiment. That is, end faces of the semiconductor chip 2 are entirely covered by the side-wall insulating film 2e. The board 3 and the semiconductor chip 2 are electrically connected with each other. The semiconductor device 1 may further include an intermediate material 7. The intermediate material 7 is located between the element part 2a and the board 3, and between a surface of the electrode part 2b and the board 3. The intermediate material 7 covers a surface of the element part 2a to isolate the covered surface from outside while the semiconductor chip 2 is being electrically connected with the board 3.

When the semiconductor chip 2 is electrically connected to the board 3, the intermediate material 7 may be placed between the element part 2a and the board 3, and between the surface of the electrode part 2b and the board 3. The intermediate material 7 is, for example, a non-conductive paste (NCP), a non-conductive film (NCF), an anisotropic conductive paste or the like, and ensures insulation of the front surface of the semiconductor chip 2.

Accordingly, it is possible to further enhance insulation of the heat sink 2c or the element part 2a from the casing 4. Further, it is possible to protect the semiconductor chip 2 and the heat sink 2c in a harsh environment, which is for example a corrosive environment.

Fifth Embodiment

A difference between the present embodiment and the above embodiments includes the followings. In the present embodiment, discrete heat sinks 2c for respective chips are preliminarily prepared. Through bonding the discrete heat sinks 2c to a semiconductor wafer, a semiconductor device 1 having a configuration of the above embodiments is manufactured.

Figure 11:
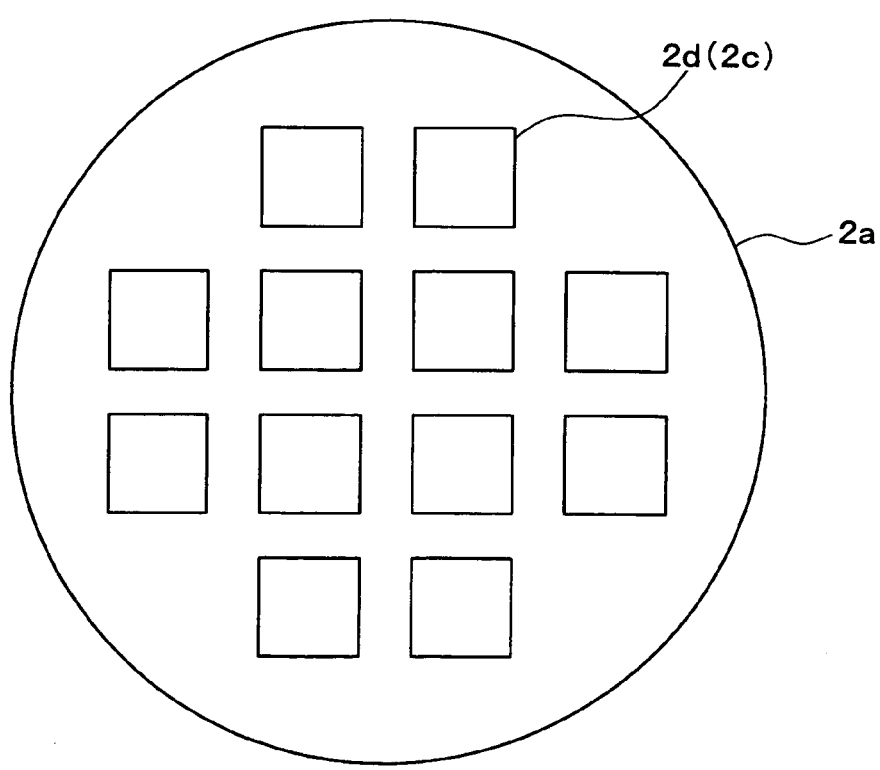
FIG. 11 is a top view that corresponds to FIG. 10A
Figure 10A:
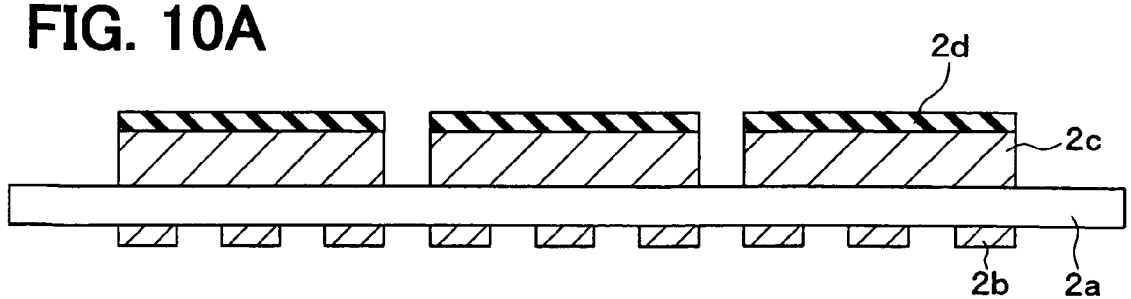
FIGS. 10A to 10C are cross sectional diagrams each illustrating a manufacturing process of a semiconductor device in accordance with a fifth embodiment.
Figure 10B:
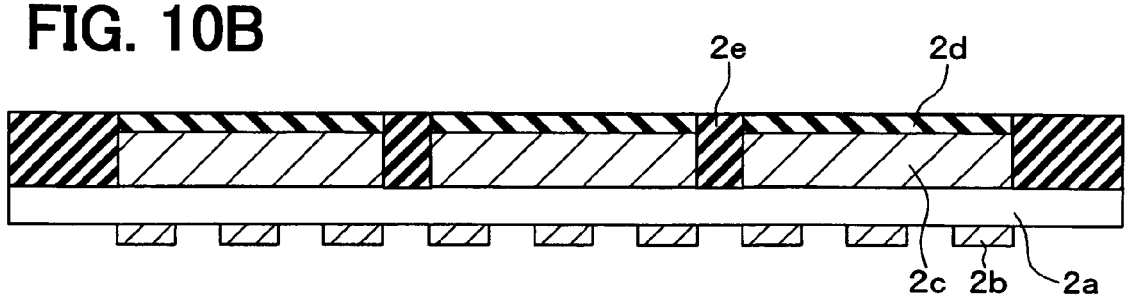
Figure 10C:
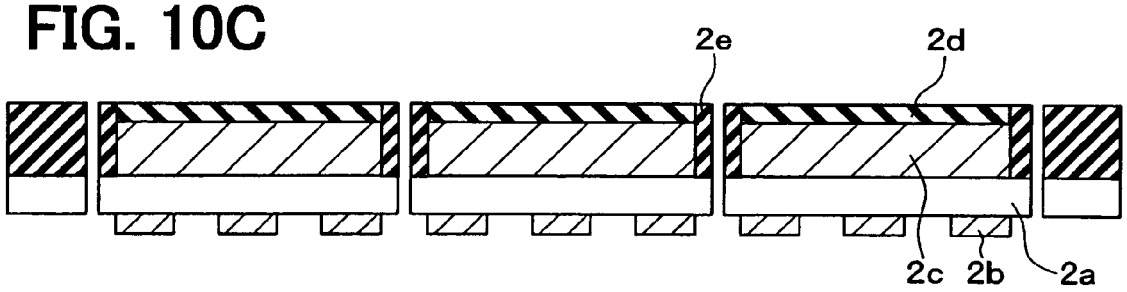

FIGS. 10A to 10C are cross sectional diagrams each illustrating a manufacturing process of a semiconductor device 1 in accordance with the present embodiment. FIG. 11 is a plan view diagram illustrating a manufacturing process that corresponds to FIG. 10A.

As shown in FIG. 10A, element parts 2a are formed in a semiconductor wafer. The discrete heat sinks 2c each having an insulating layer 2d are placed on regions that respectively correspond to element parts 2a of the semiconductor wafer. Then, as shown in FIG. 10B, a resin member is placed on a front surface of the semiconductor wafer. Thereby, a gap between the discrete heat sinks 2c are filled with the resin member and the side-wall insulation film 2e is formed. Then, as shown in FIG. 10C, dicing cut is performed along a scribe line 5 by using a dicing saw whose kerf width is smaller than the gap between the discrete heat sinks 2c. Thereby, the semiconductor wafer together with the side-wall insulating film 2e is divided into chips. According to the above manners, a semiconductor chip 2 having a configuration similar to that exemplified in FIG. 4 is manufactured. That is, the manufactured semiconductor chip 2 includes the element part 2a, the electrode part 2b, the heat sink 2c, the insulating layer 2d, and the side wall insulating film 2e covering the end surfaces of the heat sink 2c.

By using the discrete heat sinks 2c for respective chips, it is possible to manufacture a semiconductor device 1 having a configuration similar to those of the above embodiments.

Sixth Embodiment

In the present embodiment, discrete heat sinks 2c are preliminarily prepared for respective chips in a manner similar to that of a fifth embodiment. In the present embodiment, when the discrete heat sinks 2c are prepared, the discrete heat sinks 2c are placed on a support member so that the discrete heat sinks 2c are positioned at places that corresponding to respective element parts 2a.

FIGS. 12A to 12E are cross sectional diagrams each illustrating a manufacturing process of a semiconductor device 1 in accordance with the present embodiment. The processes performed after preparing heat sinks 2c, which including position the discrete heat sinks 2c at places that respectively correspond to the element parts 2a, are generally similar to those of a fifth embodiment. A difference includes the followings.

Figure 12A:
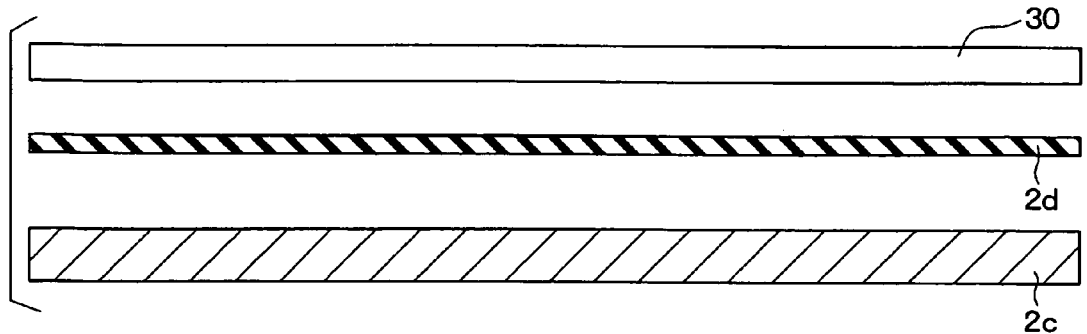
FIGS. 12A to 12E are cross sectional diagrams each illustrating a manufacturing process of a semiconductor device in accordance with a sixth embodiment.
Figure 12B:
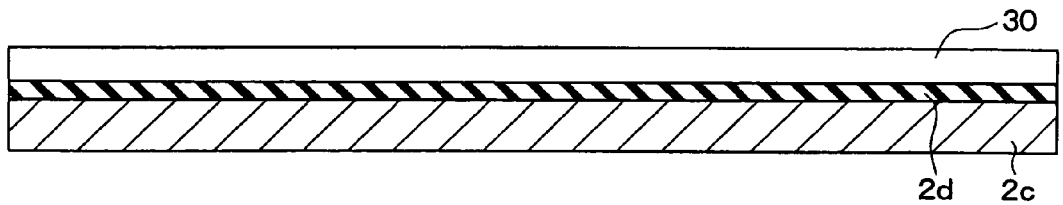
Figure 12C:
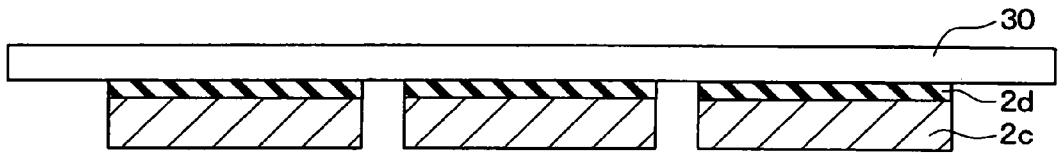

As shown in FIG. 12A, a plate shape heat sink 2c (i.e., a heat sink plate 2c), a plate shape insulating layer 2d (i.e., an insulating layer plate 2d) and a support member 30 including an adhesive member etc. are prepared. The plated shape heat sink 2c is one that has not divided into discrete portions yet and that has enough dimensions to contain multiple element parts 2c. Then, as shown in FIG. 12B, the plate shape insulating layer 2d and the support member 30 are successively bonded to the plate shape heat sink 2c. Then, as shown in FIG. 12C, the plate shape heat sink 2c and the plate shape insulating layer 2d are divided into discrete portions (i.e., discrete heat sinks 2c) for respective chips by, for example, etching. In the above process, a mask is placed on a surface of the heat sink 2c in advance of the etching. After the dividing, the discrete heat sinks 2c and the discrete insulating layers 2d are supported by the support member 30 while being respectively positioned at places that correspond to element part 2a.

Figure 12D:
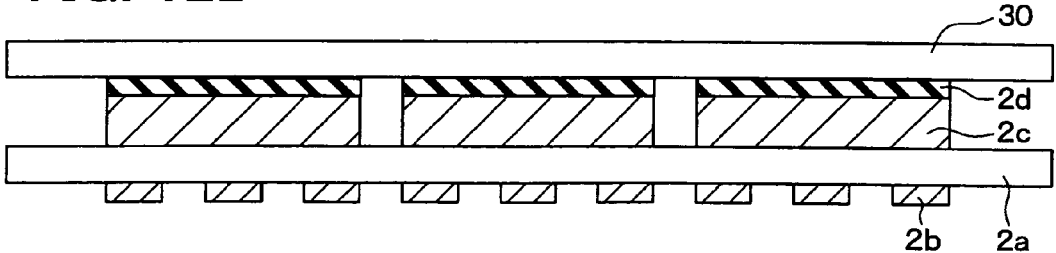
Figure 12E:
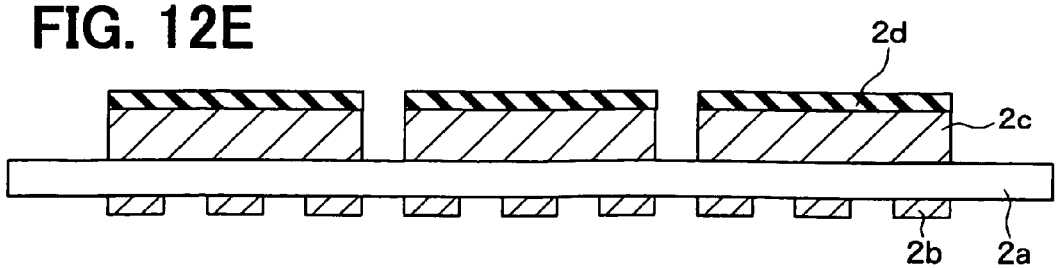

Then, as shown in FIG. 12D, by using the support member 30, the discrete heat sinks 2c each having a discrete insulating layer 2d are bonded to the semiconductor wafer. As shown in FIG. 12E, the support member 30 is removed from the heat sinks 2c, thereby to form a structure where the heat sink 2c are located on the semiconductor wafer at places that respectively correspond to the element parts 2a. After the removing, the processes generally identical to those described in FIGS. 10B and 10C are performed. Through the above manners, it is possible to manufacture a semiconductor device 1 as exemplified in FIG. 4.

According to the present embodiment, the prepared discrete heat sinks 2c are in a state where the support member 30 supports and positions the discrete heat sinks 2c at places that respectively correspond to element parts 2a. Therefore, it becomes possible to position with ease the heat sinks 2c on the semiconductor wafer.

Seventh Embodiment

In the present embodiment, discrete heat sinks 2c for respective chips are preliminarily prepared in a manner similar to that of fifth and sixth embodiments. However, a difference includes the followings: in the present embodiment, an insulating layer 2d is formed after the discrete heat sinks 2c are bonded to a semiconductor wafer.

Figure 13A:
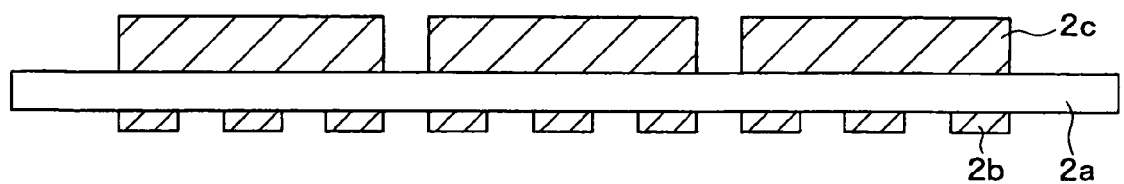
FIGS. 13A to 13C are cross sectional diagrams each illustrating a manufacturing process of a semiconductor device in accordance with a seventh embodiment.
Figure 13B:
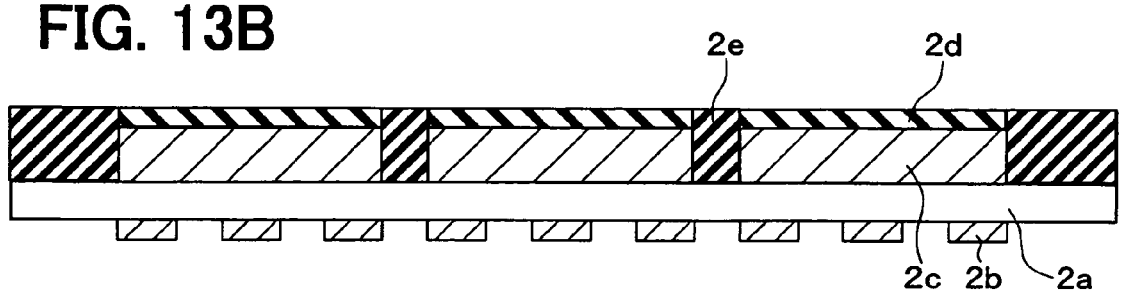
Figure 13C:
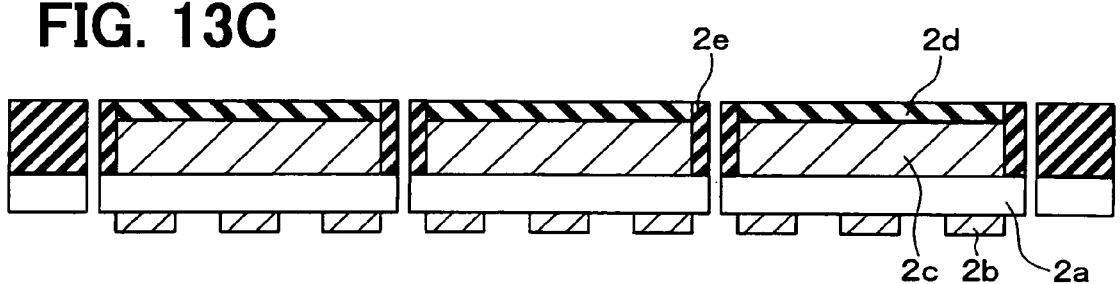

FIGS. 13A to 13C are cross sectional diagrams each illustrating a manufacturing process of a semiconductor device 1 in accordance with the present embodiment. As shown in FIG. 13A, the discrete heat sinks 2c for respective chips are placed on the semiconductor wafer. Then, as shown in FIG. 13B, a side-wall insulating film 2e and an insulating layer 2d are formed at a same time. In a process exemplified in FIG. 13C, a process generally similar to that exemplified in FIG. 10C is performed. Through the above manners, it is possible to manufacture a semiconductor device as exemplified in FIG. 4.

As described above, in the present embodiment, the insulating layers 2d are not preliminarily formed on the discrete heat sinks 2c but formed at a same time when the side-wall insulating film 2e is formed. That is, the insulating layers 2d are formed after the discrete heat sinks 2c for respective chips are placed on the semiconductor wafer. In the above example of the present embodiment, the formation of the insulating layer 2d after the bonding of the discrete heat sinks 2c to the semiconductor is performed in generally line with processes of a fifth embodiment.

Alternatively, the formation of the insulating layer 2d after the bonding of the discrete heat sinks 2c to the semiconductor can be performed in generally line with processes of a sixth embodiment. For example, the discrete heat sinks 2c cab be prepared through: placing a heat sink plate 2c on a support member 30; and dividing the heat sink plate 2c into the discrete heat sinks 2c that are supported by the support member 30. The discrete heat sinks 2c that are supported by the support member 30 are bonded to the semiconductor wafer. Then, the support member may be removed from the discrete sinks 2c, and the side-wall insulating film 2e and the insulating layer 2d may be formed at a same time.

Eighth Embodiment

The present embodiment is generally similar to fifth and sixth embodiments in that the discrete heat sinks 2c for respective chips are preliminary prepared. A difference includes a manner where a semiconductor wafer is divided into portions for respective chips before formation of the side-wall insulating film 2e.

Figure 14A:
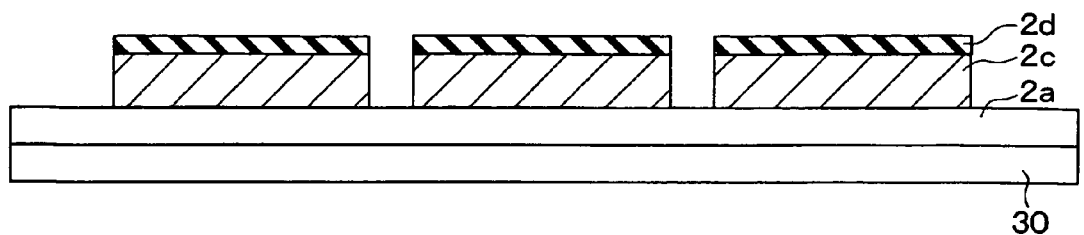
FIGS. 14A to 14D are cross sectional diagrams each illustrating a manufacturing process of a semiconductor device in accordance with an eighth embodiment.
Figure 14B:
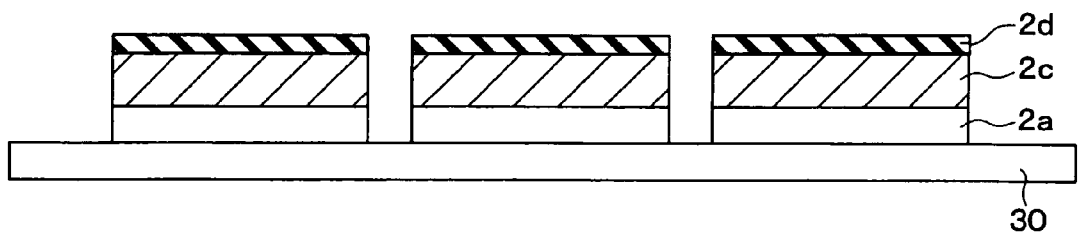

FIGS. 14A to 14D are cross sectional diagrams each illustrating a manufacturing process of a semiconductor device 1 in accordance with the present embodiment. As shown in FIG. 14A, discrete heat sinks 2c having insulating layers 2d for respective chips are placed on a front surface of a semiconductor wafer. In addition, a support member 30 including an adhesive member etc. is bonded to a rear surface of the semiconductor wafer, which rear surface is opposite to the front surface on which the heat sink 2c and the insulating layer 2d are placed. Then, as shown in FIG. 14B, the semiconductor wafer is etched while utilizing the heat sink 2c with the insulating layer 2d as a mask, so that the semiconductor wafer is divided into portions for respective chips.

Figure 14C:
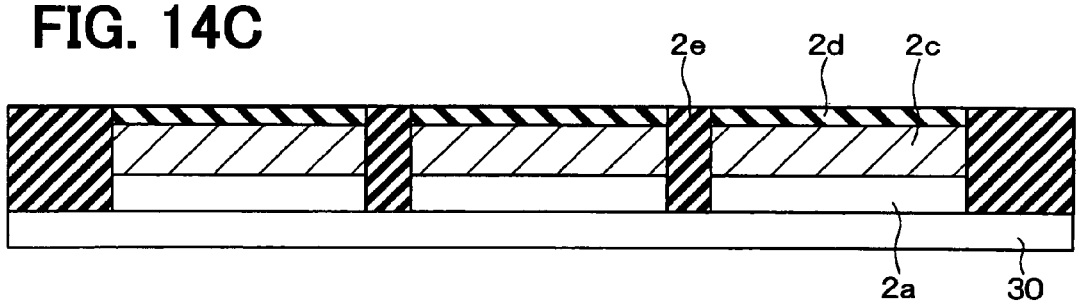
Figure 14D:
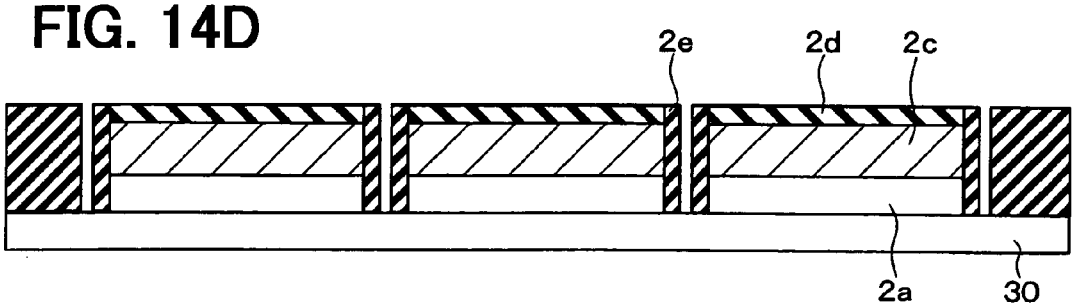

As shown in FIG. 14C, a resin member is placed on an upper surface side of the support member 30. Thereby, a gap between the discrete heat sinks 2c and a gap between the element parts 2a is filled with an insulating material to form the side-wall insulating film 2e. Then, as shown in FIG. 14D, dicing cut is made along a scribe line 5 by using a dicing saw whose kerf width is smaller than the gap between the element parts 2a and the gap between the discrete heat sinks 2c. Thereby, the semiconductor wafer together with the side-wall insulating film 2e is divided into portions for chips. Through the above manners, there is provided a configuration as exemplified in FIG. 4.

As described above, it is possible to form the side-wall insulating film 2e after a semiconductor wafer is divided into portions for respective chips to provide discrete the discrete element parts 2a in addition to the discrete heat sinks 2c.

In the above processes, the insulating layers 2d and the side-wall insulating film 2e may be formed at a same time in manners similar to a seventh embodiment, instead of preparing the discrete heat sinks 2c having the insulating layers 2d for respective chips. That is, the insulating layers 2d may not be located on the heat sinks 2c before the semiconductor wafer is divided into portions for respective chips. The insulating layers 2d may be formed on the heat sinks 2c at a same time when the side-wall insulating film 2e is formed, as shown in FIG. 14c.

Ninth Embodiment

In the present embodiment, there will be described below a method of manufacturing a semiconductor device utilizing a Silicon on Insulator (SOI) substrate as a semiconductor wafer and having a configuration as exemplified in FIG. 4.

Figure 15A:
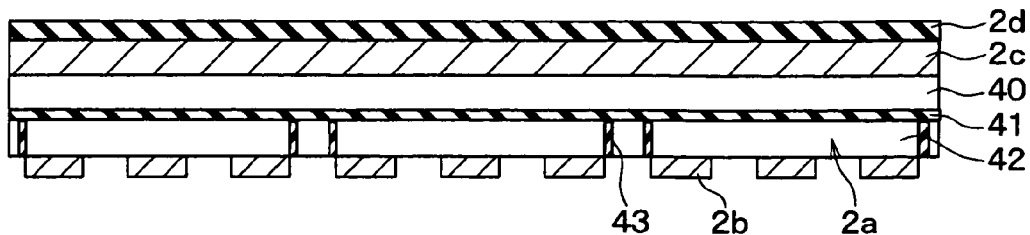
FIGS. 15A to 15D are cross sectional diagrams each illustrating a manufacturing process of a semiconductor device in accordance with a ninth embodiment.

FIGS. 15A to 15D are cross sectional diagrams each illustrating a manufacturing process of a semiconductor device 1 in accordance with the present embodiment. As shown in FIG. 15A, an SOI substrate has an active layer 42, a support base 40 and a buried insulation film 41 located between the active layer 42 and the support base 40. In the use of SOI substrate, when an element isolation trench 43 formed in the active layer 42 surrounds the element parts 2a, it becomes possible to insulate the element parts 2a from an end face of a semiconductor chip 2. Thus, in the present embodiment, the element isolation trench 43 is formed along and on both sides of a scribe line 5 when the element parts 2a are formed.

Figure 16:
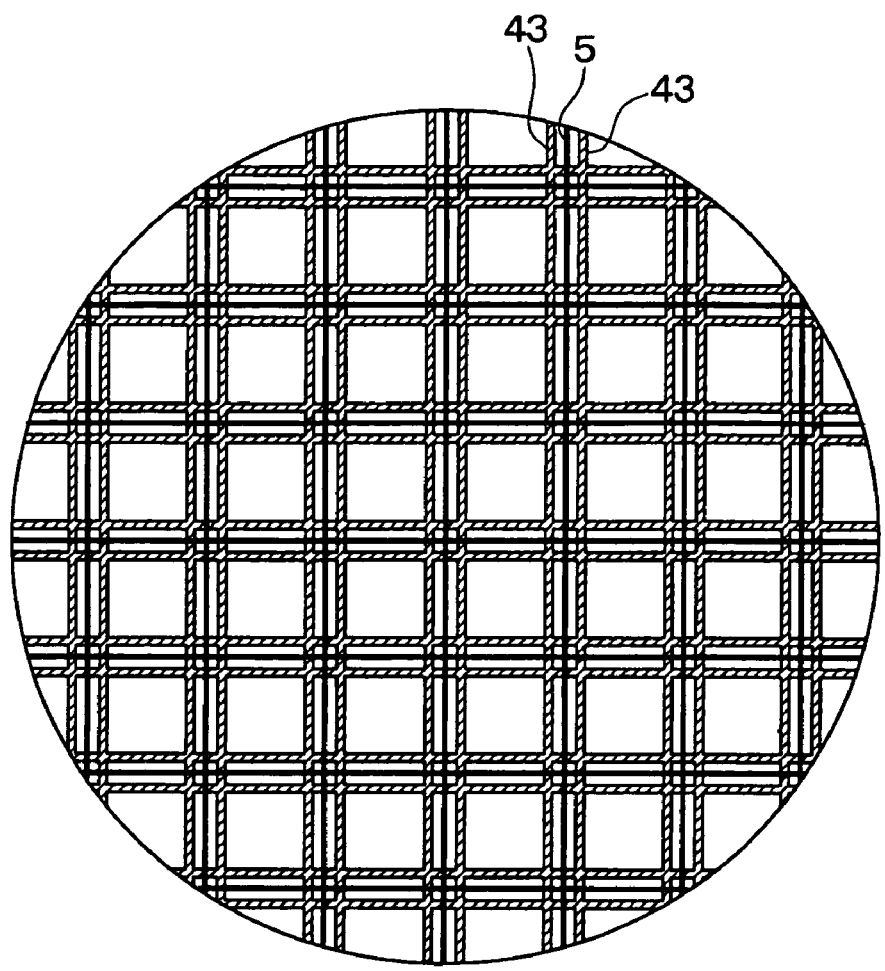
FIG. 16 is a top view illustrating a layout of a scribe line and an element isolation trench.

FIG. 16 is a top view illustrating a layout of a scribe line 5 and an element isolation trench 43. It should be noted that, although FIG. 16 is not a sectional view, a region corresponding to the element isolation trench 43 is illustrated with hatching in FIG. 16 for clarification.

As shown in FIG. 16, the element isolation trench 43 is formed along an on both sides of whole scribe line 5. Side walls of the element isolation trench structure 43 are parallel to each other. A width of the element isolation trench 43 is larger than a kerf width that is to be produced in a cutting process. Also, the width of the element isolation trench 43 is set to a dimension enough to ensure a thickness of the side-wall insulating film 2e that is to be formed in a later process.

Figure 15B:
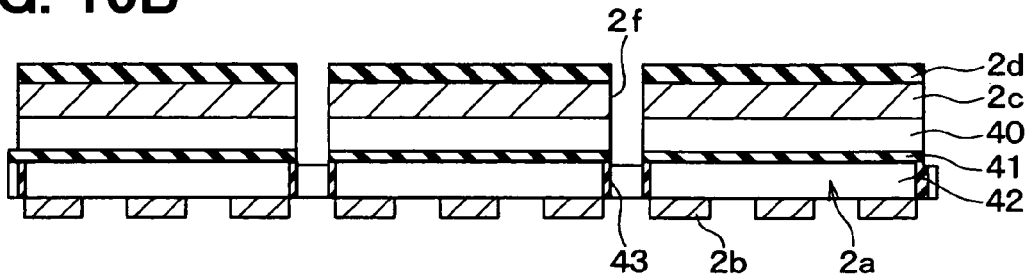

Then, a heat sink 2c and an insulating layer 2d are bonded to a rear surface side of the SOI substrate that an element part 2a has been formed in. Then, as shown in FIG. 15B, a ditch 2f is formed along the scribe line 5 from an insulating layer 2d side in a manner similar to that exemplified in FIG. 6B according to a second embodiment. In the above process, the ditch 2f is formed to reach to at least the buried insulating film 41.

Figure 15C:
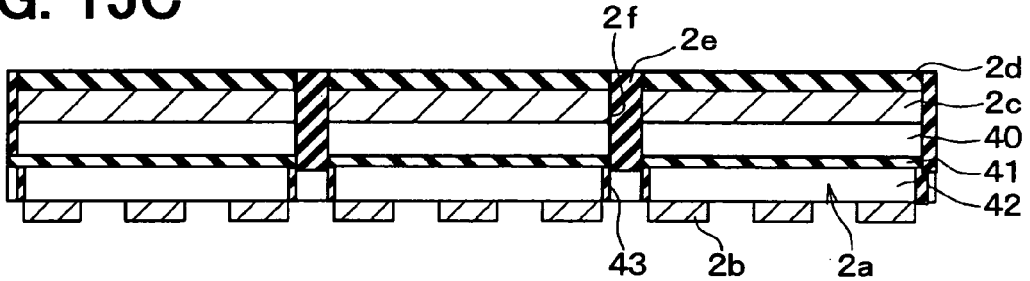
Figure 15D:
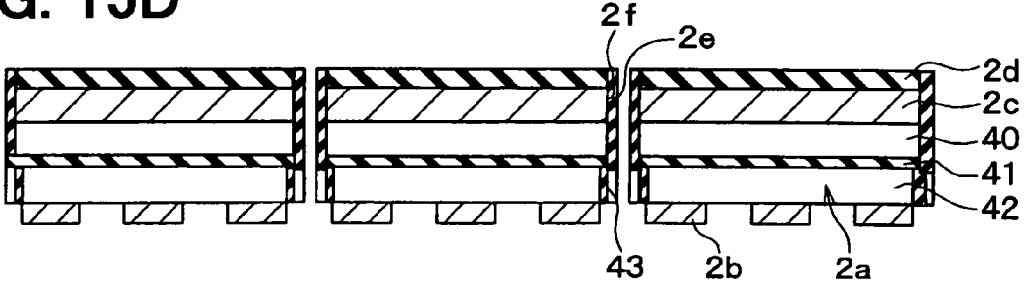

As shown in FIG. 15C, a side wall insulating film 2e is formed by filling the ditch 2f with an insulating material. Then, as shown in FIG. 15D, the semiconductor wafer together with the side-wall insulating film 2e are divided into chips by cutting along the scribe line 5. Thereby, a semiconductor device 1 with a configuration similar to that exemplified in FIG. 4 is manufactured by using an SOI substrate.

As described above, when an SOI substrate is employed, it is also possible to manufacture a semiconductor device 1 having a configuration similar to that exemplified in FIG. 4.

Tenth Embodiment

In the present embodiment, a ditch 2f for providing a side-wall insulating film 2e is formed in a manner similar to that in third and ninth embodiments. A difference includes the followings: the ditch 2f is formed not through cutting from a heat sink 2c side but through cutting from a semiconductor wafer side.

Figure 17A:
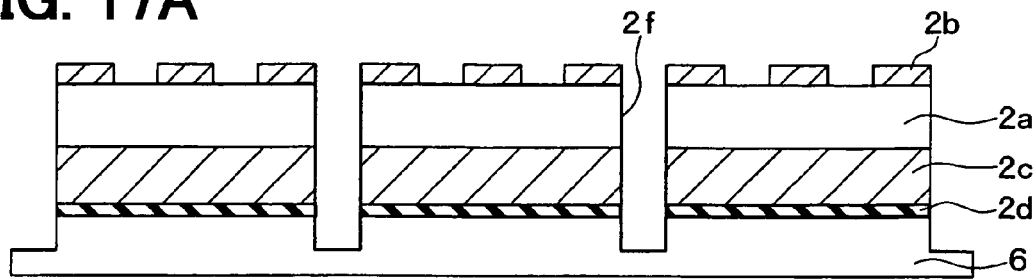
FIGS. 17A to 17D are cross sectional diagrams each illustrating a manufacturing process of a semiconductor device in accordance with a tenth embodiment.

FIGS. 17A to 17D are cross sectional diagrams each illustrating a manufacturing process of a semiconductor device 1 in accordance with the present embodiment. As shown in FIG. 17A, a structure is formed in which heat sinks 2c and insulating layers 2d are placed on a rear surface side of a semiconductor wafer that semiconductor elements have been formed in. Then, a support member 6 is fixed and bonded not on a front surface side of the semiconductor wafer but on an insulating layer 2d side. The semiconductor wafer is cut along a scribe line 5 from a semiconductor wafer side and divided into chips. Thereby, a ditch 2f is formed so as to have a depth reaching to the support member 6 and so as to be not so deep to divide the support member 6 into pieces.

Figure 17B:
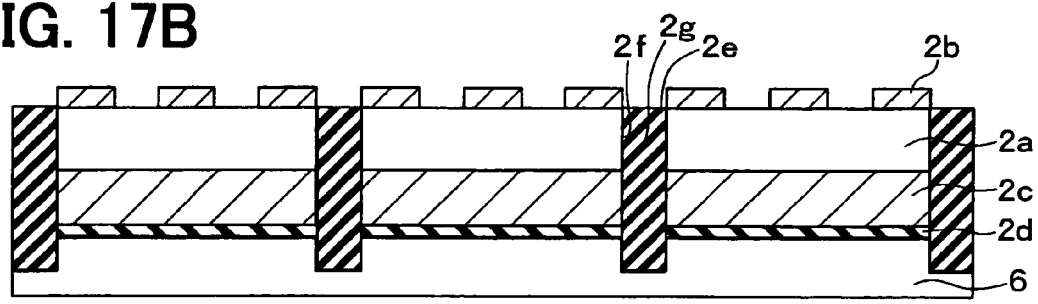
Figure 17C:
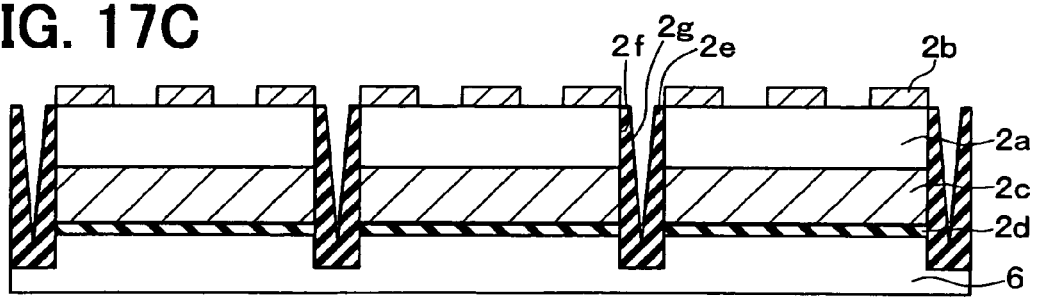
Figure 17D:
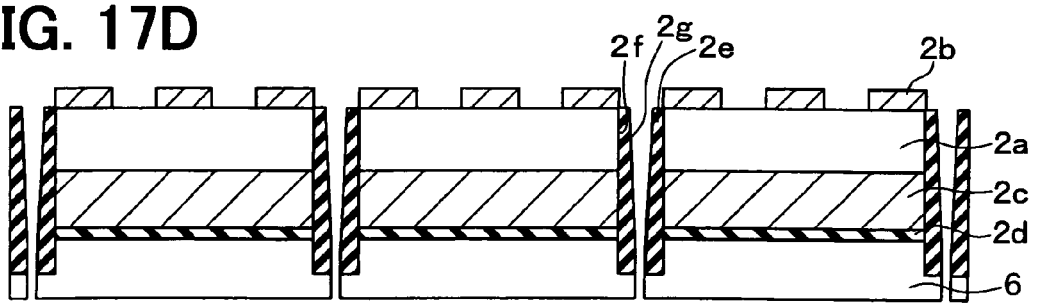

Then, as shown in FIG. 17B, the ditch 2f is filled with an insulating material to from a side-wall insulating film 2e. As shown in FIG. 17C, a trench 2g is formed in a center part of the side-wall insulating film 2e by, for example, dry etching, so that the trench 2g has a smaller width in a deeper part, that is, the trench 2g has side surfaces with a tapered shape. The trench 2g has a depth deeper than the insulating layer 2d. Then, as shown in FIG. 17D, a cutting process is performed by using, for example, a dicing saw, so that cutting of the side-wall insulating film 2e provides chips. Through the above manners, it is possible to manufacture a semiconductor device 1 having a configuration exemplified in FIG. 4.

According to the present embodiment, the support member 6 can be removed. Alternatively, the support member 6 may not be removed and may be utilized as a part of the semiconductor chip.

As described above, it is also possible to manufacture a semiconductor device 1 having a configuration similar to that exemplified in FIG. 4, through dicing cut from the semiconductor wafer side. To form the side-wall insulating film 2e, it may not be necessary to form the trench 2g. However, the formation of the trench 2g may allow the followings. When the semiconductor device 1 is one that is to be mounted to a casing (not shown) or a circuit board (not shown) in a face-up mounting manner, since the side wall of the side-wall insulating film 2e is tapered, it is possible to depositing a conductive layer on the tapered side wall and it is possible form a wiring pattern by pattering the conductive pattern.

Modifications

A semiconductor device 1 according to the above embodiments can be modified in various ways. For example, although the above embodiments give examples of semiconductor devices 1 as those having sectional configurations shown in the drawings, a semiconductor device 1 can have various alternative configurations.

In the above embodiments, a heat sink 2c is used as an element for heat radiation. Alternatively, a configuration and a method according to the above embodiments may be applied to such a semiconductor chip 2 where: a heat sink 2c functions as a member for conducting a current in a lateral direction, which may be parallel to the front surface of the semiconductor chip 2.

Figure 18:
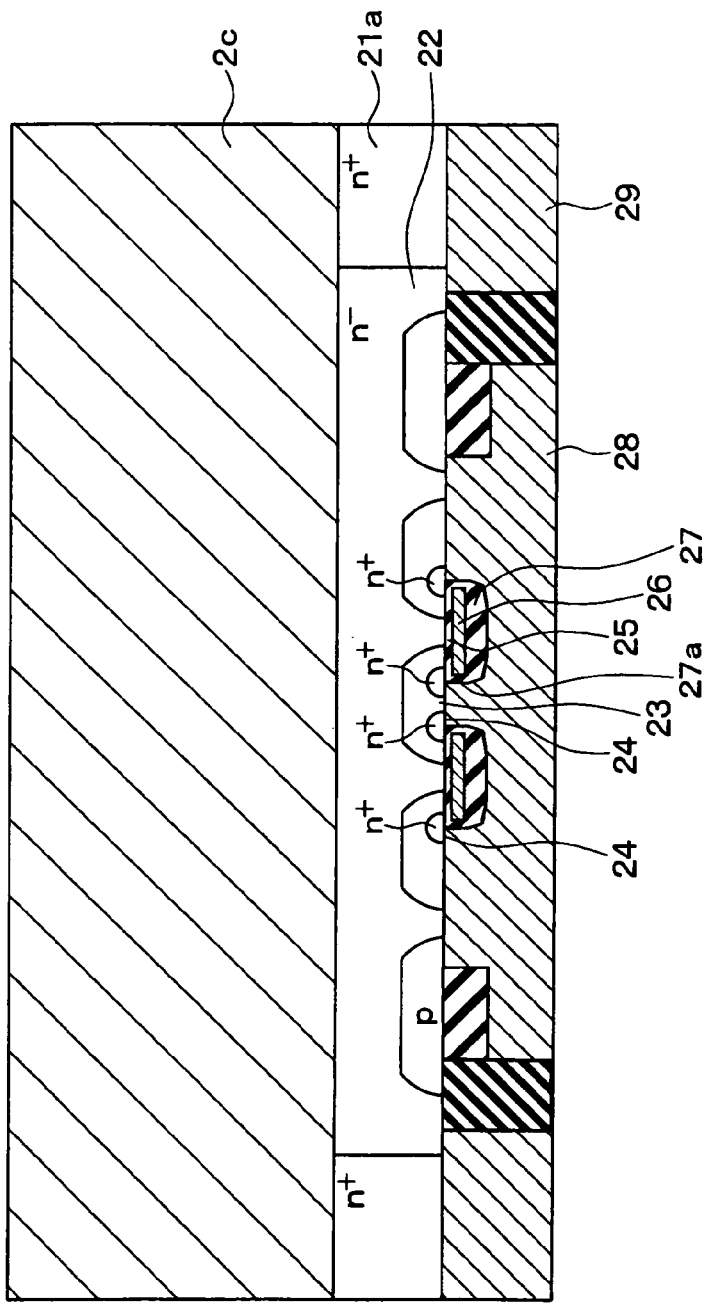
FIG. 18 is a cross sectional diagram illustrating a semiconductor element in accordance with a modification example.

FIG. 18 is a cross sectional diagram illustrating a semiconductor element where a heat sink 2c functions as an element for conducting a current in the lateral direction. A basic configuration of such a semiconductor element is similar to that of a MOSFET exemplified in FIG. 3. A difference includes a configuration where the semiconductor element does not include an n+ type substrate 21 illustrated in FIG. 3 and includes a heat sink 2c. In such a configuration, the heat sink 2c provides a current path for conducting a source-drain current. In such a semiconductor element, a current may flow in the lateral direction. The above embodiments are applicable to an element having such a configuration.

The heat sink 2c can be made of metal. Alternatively, the heat sink 2c may be made of a material having a high thermal conductivity. For example, a silicon substrate itself may be utilized as a heat sink 2c.

In examples of the above embodiments, the casing 4 and the insulating layer 2d contacts with each other. Alternatively, the casing 4 and the insulating layer 2d may not contact with each other. For example, the casing 4 and the insulating layer 2d may be spaced a predetermined distance away from each other. The predetermined distances may be set so as to allow favorable heat conduction therebetween, and may be 1 μm for instance.

In the above embodiments, after the insulating layer 2d is bonded to the heat sink 2c, the ditch 2f is filled with an insulating material in such a manner as exemplified in FIG. 6C, FIG. 8B or the like. Alternatively, the insulating layer 2d may not be preliminarily formed on the heat sink 2c, but the insulating layer 2d may be formed at a same time when the side-wall insulating layer 2e is formed, by applying the insulating material to a surface of the heat sink 2c in addition to the ditch 2f.

Figure 19:
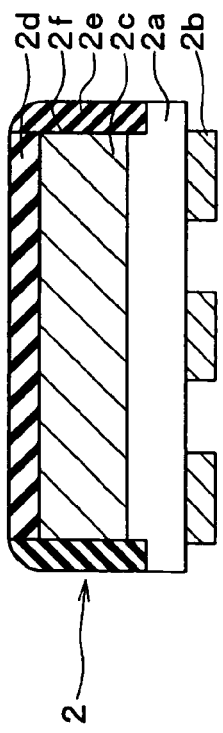
FIG. 19 is a cross sectional diagram illustrating semiconductor chip in accordance with another modification example.

In second and third embodiments, an insulating material is placed in the ditch 2f, and then, the dicing cut is performed. In such a case, a corner portion of the semiconductor chip 2, that is, an end portion of the side-wall insulating layer 2e may become sharp. As shown in FIG. 19, the end portion of the side-wall insulating layer 2e may be made rounded by, for example, polishing, etching (e.g., physical etching, chemical etching), or the like.

In the above embodiments, the ditch 2f is fully filled. Alternatively, the ditch 2f may be partially filled with an insulating member if the insulating member formed on a side wall of the ditch 2f can have a thickness enough to provide, for example, a side-wall insulating film 2e.

In the above embodiments, a semiconductor device mainly employs a face-down mounting structure. Alternatively, a configuration of the above embodiments is applicable to a semiconductor device that employs a face-up mounting structure. A semiconductor device with a face-up mounting structure can be manufactured by utilizing a method of the above embodiments.

While the invention has been described above with reference to various embodiments thereof, it is to be understood that the invention is not limited to the above described embodiments and construction. The invention is intended to cover various modifications and equivalent arrangements. In addition, while the various combinations and configurations described above are contemplated as embodying the invention, other combinations and configurations, including more, less or only a single element, are also contemplated as being within the scope of embodiments.

What is claimed is:

1. A method for manufacturing a semiconductor device, the method comprising:
   forming an insulating layer on a first surface of a heat sink, wherein the heat sink has a second surface opposite to the first surface;
   preparing a semiconductor wafer having first and second surfaces opposite to each other, wherein the semiconductor wafer includes an element part having an element, wherein the semiconductor wafer further includes an electrode part located on the element part to provide an electric connection to the element of the element part, wherein the electrode part is disposed on the first surface of the semiconductor wafer;
   bonding the second surface of the heat sink to the second surface of semiconductor wafer;
   forming a semiconductor chip through a cutting process, wherein the cutting process includes
      dividing the semiconductor wafer together with the heat sink and the insulating layer into chips by cutting along a scribe line;
   mounting the semiconductor chip to a board having a wiring pattern, so that the electrode part of the semiconductor chip is electrically connected to the wiring pattern of the board; and
   positioning the semiconductor chip and the board relative to a casing made of metal, wherein the positioning includes
      directing the insulating layer of the semiconductor chip to the casing to enable heat radiation from the heat sink toward the casing via the insulating layer.

2. The method according to claim 1, further comprising:
   forming a ditch from an insulating layer side before the cutting process is performed, wherein the ditch has the scribe line and a width larger than a kerf width that is to be produced in the cutting process; and
   filling the ditch with an insulating material, wherein:
   the cutting along the scribe line in the cutting process provides the semiconductor chip having a side-wall insulating film that is made of the insulating material and that covers an end face of the heat sink.

3. The method according to claim 2, wherein
   the forming of the ditch includes:
      cutting the insulation layer and the heat sink; and
      removing a portion of the semiconductor wafer, so that the ditch has a predetermined depth that reaches to the semiconductor wafer.

4. The method according to claim 2, further comprising:
   bonding a support member to the electrode part and the first surface of the semiconductor wafer before the forming of the semiconductor chip, wherein:
   the ditch is formed in a state where the electrode part and the first surface of the semiconductor wafer is bonded to the support member;
   the ditch is formed so as to have a predetermined depth that penetrates the insulating layer, the heat sink and the semiconductor wafer; and
   the semiconductor chip is formed so that the side-wall insulating film covers all of end faces of the heat sink and all of end faces of the element part.

5. The method according to claim 4, wherein:
   the mounting of the semiconductor chip to the board includes:
      placing an intermediate material between the first surface of the semiconductor chip and the board, wherein the intermediate material includes at least one of a non-conductive paste, a non-conductive film and an anisotropic conductive paste.

6. The method according to claim 1, further comprising:
   bonding a support member to a surface of the insulating layer before the forming of the semiconductor chip;
   forming a ditch having the scribe line, wherein the forming of the ditch includes
      cutting the semiconductor wafer, the heat sink and the insulating layer from a semiconductor wafer side, so that the ditch has a width larger than a kerf width that is to be produced in the cutting process; and
   filling the ditch with an insulating material, wherein
   the cutting along the scribe line in the cutting process provides the semiconductor chip having a side-wall insulating film that is made of the insulating material, and that covers an end face of the heat sink.

7. The method according to claim 6, further comprising
   forming a trench, along the scribe line, in the ditch filled with the insulating material, after the filling of the ditch with the insulating material, so that the trench has a tapered side wall and has a depth deeper than the insulating layer, wherein:
   the cutting along the trench in the cutting process provides the semiconductor chip having the side-wall insulating film.

8. A method for manufacturing a semiconductor device, the method comprising:
   preparing a plurality of discrete heat sinks each having first and second surfaces opposite to each other, wherein each of the discrete heat sinks has an insulating layer on the first surface of the each of the discrete heat sinks;
   preparing a semiconductor wafer having first and second surfaces opposite to each other, wherein the semiconductor wafer has:
      a plurality of element parts each having an element; and
      a plurality of electrode parts disposed on the first surface of the semiconductor wafer, wherein the electrode parts are respectively located on the element parts so that each of the electrode parts provides an electric connection to a corresponding one of the element parts;
   bonding the discrete heat sinks to the semiconductor wafer, so that: the second surface of the each of the discrete heat sinks is bonded to the second surface of the semiconductor wafer; and the discrete heat sinks are respectively located on places that correspond to the element parts;
   forming a semiconductor chip through a cutting process, wherein the cutting process includes
      dividing into chips the semiconductor wafer to which the discrete heat sinks are bonded, by cutting along a scribe line, so that each chip has a corresponding one of the discrete heat sinks and a corresponding one of the element parts;
   mounting the semiconductor chip to a board having a wiring pattern, so that the electrode part of the semiconductor chip is electrically connected to the wiring pattern of the board; and
   positioning the semiconductor chip and the board relative to a casing made of metal, wherein the positioning includes
      directing the insulating layer of the semiconductor chip to the casing to enable heat radiation from the heat sink toward the casing via the insulating layer.

9. The method according to claim 8, wherein:
the preparing of the discrete heat sinks includes:
placing a heat sink plate on a first surface of an insulating layer plate;
placing a support member on a second surface of the insulating layer plate, wherein the first and second surfaces of the insulating layer plate are opposite to each other; and
dividing the heat sink plate together with the insulating layer plate into the discrete heat sinks that are supported by the support member, wherein:
in the bonding of the discrete heat sinks to the semiconductor wafer, the discrete heat sinks that are supported by the support member are bonded to the semiconductor wafer.

10. The method according to claim 8, wherein
the forming of the semiconductor chip includes
filling a gap between the discrete heat sinks with an insulating material, wherein:
the cutting process includes:
cutting, along the scribe line, the insulating material together with the semiconductor wafer to which the discrete heat sinks are bonded; and
the cutting through the scribe line provides the semiconductor chip having a side-wall insulating film that is made of the insulating material and that covers an end face of the heat sink.

11. The method according to claim 8, wherein
the forming of the semiconductor chip includes:
boding a support member to the first surface of the semiconductor wafer;
cutting, along the scribe line, the semiconductor wafer to which the discrete heat sinks are bonded, so that the semiconductor wafer is divide into portions each having a corresponding one of the element parts;
filling a gap between the discrete heat sinks and a gap between the divided portions of the semiconductor wafer with an insulating material; and
cutting the insulating material along the scribe line to provides chips, wherein the semiconductor chip has a side-wall insulating film that is made of the insulating material and that covers an end face of the heat sink and an end face of the element part.

12. A method for manufacturing a semiconductor device, the method comprising:
preparing a plurality of discrete heat sinks each having first and second surfaces opposite to each other;
preparing a semiconductor wafer having first and second surfaces opposite to each other, wherein the semiconductor wafer has:
a plurality of element parts each having an element; and
a plurality of electrode parts disposed on the first surface of the semiconductor wafer, wherein the electrode parts are respectively located on the element parts so that each of the electrode parts provides an electric connection to a corresponding one of the element parts;
bonding the discrete heat sinks to the semiconductor wafer so that:
the second surface of the each of the discrete heat sinks is bonded to the second surface of the semiconductor wafer; and
the discrete heat sinks are respectively located on places that correspond to the element parts;
filling a gap between the discrete heat sinks with an insulating material and forming an insulating layer on the first surface of each of the discrete heat sink;
forming a semiconductor chip through a cutting process, wherein the cutting process includes
cutting, along a scribe line, the insulating material together with the semiconductor wafer to which the discrete heat sinks are bonded, so that: chips are provided by dividing; each chip has a corresponding one of the discrete heat sinks and a corresponding one of the element parts; and the each chip has a side-wall insulating film that is made of the insulating material and that covers an end face of the heat sink;
mounting the semiconductor chip to a board having a wiring pattern, so that the electrode part of the semiconductor chip is electrically connected to the wiring pattern of the board; and
positioning the semiconductor chip and the board relative to a casing made of metal, wherein the positioning includes
directing the insulating layer of the semiconductor chip to the casing to enable heat radiation from the heat sink toward the casing via the insulating layer.

13. The method according to claim 12, wherein:
the preparing of the discrete heat sinks includes:
placing a heat sink plate on a support member; and
dividing the heat sink plate into the discrete heat sinks that are supported by the support member, wherein:
in the bonding of the discrete heat sinks to the semiconductor wafer, the discrete heat sinks that are supported by the support member are bonded to the semiconductor wafer.

14. The method according to claim 12, wherein:
the filling of the gap between the discrete heat sinks and the forming of the insulating layer includes:
cutting the semiconductor wafer to which the discrete heat sinks are bonded, so that the semiconductor wafer is divided into portions, wherein each portion has a corresponding one of the element parts;
the filling with the insulating material a gap between the divided portions of the semiconductor wafer in addition to the gap between the discrete heat sinks, wherein:
the forming of the semiconductor chip includes:
cutting the insulating material along the scribe line to provide chips by dividing, so that the semiconductor chip has the side-wall insulating film that covers an end face of the heat sink and an end face of the element part.

15. A method for manufacturing a semiconductor device, the method comprising:
preparing a plurality of discrete heat sinks each having first and second surfaces opposite to each other, wherein each of the discrete heat sinks has an insulating layer on the first surface the each of the discrete heat sinks;
preparing a semiconductor wafer having first and second surfaces opposite to each other, wherein the semiconductor wafer has:
a plurality of element parts each having an element; and
a plurality of electrode parts respectively located on the element parts, wherein the electrode parts are disposed on the first surface of the semiconductor wafer, so that each of the electrode parts provides an electrical connection to the element of a corresponding one of the element parts;
bonding the discrete heat sinks to the semiconductor wafer so that:
the second surface of the each of the discrete heat sinks is bonded to the second surface of the semiconductor wafer; and the discrete heat sinks are respectively located on places that correspond to the element parts;

bonding a support member to the first surface of the semiconductor wafer;

dividing into portions the semiconductor wafer to which the discrete heat sinks are bonded, so that the divided portions respectively have the element parts;

filling with an insulating material a gap between the discrete heat sinks and a gap between the element parts;

forming a semiconductor chip through a cutting process, wherein the cutting process includes
cutting the insulating material along a scribe line to provide chips by dividing, so that the semiconductor chip has a side-wall insulating film that is made of the insulating material and that covers an end face of the heat sink and an end face of the element part;

mounting the semiconductor chip to a board having a wiring pattern, so that the electrode part of the semiconductor chip is electrically connected to the wiring pattern of the board; and positioning the semiconductor chip and the board relative to a casing made of metal, wherein the positioning includes
directing the insulating layer of the semiconductor chip to the casing to enable heat radiation from the heat sink toward the casing via the insulating layer.

16. The method according to claim 15, wherein:
the dividing of the semiconductor wafer into the portions includes:
etching the semiconductor wafer while utilizing the discrete heat sinks as a mask.

17. The method according to claim 1, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

18. The method according claim 3, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer of the SOI substrate, the first and second trenches being respectively located on both sides of the scribe line, wherein:
the predetermined depth of the ditch reaches to the buried insulating layer.

19. A method for manufacturing a semiconductor device, the method comprising:
forming an insulating layer on a first surface of a heat sink, wherein the heat sink has a second surface opposite to the first surface;
preparing a semiconductor wafer having first and second surfaces opposite to each other, wherein the semiconductor wafer includes:
an element part having an element; and
an electrode part located on the element part to provide an electric connection to the element of the element part, wherein the electrode part is disposed on the first surface of the semiconductor wafer;
bonding the second surface of the heat sink to the second surface of semiconductor wafer; and
forming a semiconductor chip through a cutting process, wherein the cutting process includes
dividing the semiconductor wafer together with the heat sink and the insulating layer into chips by cutting along a scribe line.

20. The method according to claim 9, wherein:
the forming of the semiconductor chip includes
filling a gap between the discrete heat sinks with an insulating material, wherein:
the cutting process includes:
cutting, along the scribe line, the insulating material together with the semiconductor wafer to which the discrete heat sinks are bonded; and
the cutting through the scribe line provides the semiconductor chip having a side-wall insulating film that is made of the insulating material and that covers an end face of the heat sink.

21. The method according to claim 9, wherein
the forming of the semiconductor chip includes:
boding a support member to the first surface of the semiconductor wafer;
cutting, along the scribe line, the semiconductor wafer to which the discrete heat sinks are bonded, so that the semiconductor wafer is divide into portions each having a corresponding one of the element parts;
filling a gap between the discrete heat sinks and a gap between the divided portions of the semiconductor wafer with an insulating material; and
cutting the insulating material along the scribe line to provides chips, wherein the semiconductor chip has a side-wall insulating film that is made of the insulating material and that covers an end face of the heat sink and an end face of the element part.

22. The method according to claim 13, wherein:
the filling of the gap between the discrete heat sinks and the forming of the insulating layer includes:
cutting the semiconductor wafer to which the discrete heat sinks are bonded, so that the semiconductor wafer is divided into portions, wherein each portion has a corresponding one of the element parts;
the filling with the insulating material a gap between the divided portions of the semiconductor wafer in addition to the gap between the discrete heat sinks, wherein:
the forming of the semiconductor chip includes:
cutting the insulating material along the scribe line to provide chips by dividing, so that the semiconductor chip has the side-wall insulating film that covers an end face of the heat sink and an end face of the element part.

23. The method according to claim 14, wherein
the dividing of the semiconductor wafer into the portions includes:
etching the semiconductor wafer while utilizing the discrete heat sinks as a mask.

24. The method according to claim 22, wherein
the dividing of the semiconductor wafer into the portions includes:
etching the semiconductor wafer while utilizing the discrete heat sinks as a mask.

25. The method according to claim 2, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

26. The method according to claim 3, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

27. The method according to claim 4, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

28. The method according to claim 5, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

29. The method according to claim 6, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

30. The method according to claim 7, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

31. The method according to claim 8, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

32. The method according to claim 9, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

33. The method according to claim 10, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

34. The method according to claim 11, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

35. The method according to claim 12, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

36. The method according to claim 13, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

37. The method according to claim 14, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

38. The method according to claim 15, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

39. The method according to claim 16, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

40. The method according to claim 20, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

41. The method according to claim 21, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

42. The method according to claim 22, further comprising:
preparing an SOI substrate as the semiconductor wafer, wherein the SOI substrate includes a support substrate, an active layer and a buried insulating layer located between the support substrate and the active layer; and forming a first trench and a second trench in the active layer, the first and second trenches being respectively located on both sides of the scribe line.

43. The method according to claim 23, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

44. The method according to claim 24, further comprising:
preparing an SOI substrate as the semiconductor wafer, wherein the SOI substrate includes a support substrate, an active layer and a buried insulating layer located between the support substrate and the active layer; and
forming a first trench and a second trench in the active layer, the first and second trenches being respectively located on both sides of the scribe line.

* * * * *